(12) United States Patent
Nishimura

(10) Patent No.: US 8,427,236 B2
(45) Date of Patent: Apr. 23, 2013

(54) OPERATIONAL AMPLIFIER, DRIVER AND DISPLAY

(75) Inventor: Kouichi Nishimura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 568 days.

(21) Appl. No.: 12/662,457

(22) Filed: Apr. 19, 2010

(65) Prior Publication Data

US 2010/0265273 A1    Oct. 21, 2010

(30) Foreign Application Priority Data

Apr. 21, 2009 (JP) ................................. 2009-103187

(51) Int. Cl.
    *H03F 3/45* (2006.01)
(52) U.S. Cl.
    USPC .............................. 330/255; 330/69; 330/260
(58) Field of Classification Search .................... 330/69, 330/255, 260
    See application file for complete search history.

(56) References Cited

U.S. PATENT DOCUMENTS

| 7,274,254 B2 * | 9/2007 | Hsieh ............................... 330/51 |
| 7,724,089 B2 * | 5/2010 | Miyamoto et al. ............. 330/255 |
| 8,063,699 B2 * | 11/2011 | Fan et al. ........................ 330/51 |
| 8,232,842 B1 * | 7/2012 | Huang ........................... 330/264 |
| 8,283,981 B2 * | 10/2012 | Wakamatsu .................. 330/258 |
| 2002/0067207 A1 | 6/2002 | Kato |
| 2007/0085603 A1 * | 4/2007 | Sung .............................. 330/75 |
| 2011/0123049 A1 * | 5/2011 | Crespi et al. .................. 381/121 |

FOREIGN PATENT DOCUMENTS

JP    2002-175052    6/2002

* cited by examiner

*Primary Examiner* — Patricia Nguyen
(74) *Attorney, Agent, or Firm* — McGinn IP Law Group, PLLC

(57) ABSTRACT

An operational amplifier includes an input differential stage having one external input receiving an external input voltage and two outputs; and two output stages. A switch section is provided between inputs of the two output stages and the two outputs of the input differential stage, and is configured to alternately connect the two outputs of the input differential stage and inputs of a positive-only output stage of the two output stages; and the two outputs of the input differential stage and inputs of a negative-only output stage of the two output stages.

17 Claims, 19 Drawing Sheets

Fig. 16

| INPUT VOLTAGE | VDD/2~VDD | VSS~VDD/2 |
|---|---|---|
| SEL | 1ST POLARITY SIGNAL | 2ND POLARITY SIGNAL |
| S15, S17 | ON | OFF |
| S16, S18 | OFF | ON |

Fig. 17

| INPUT VOLTAGE | VDD/2~VDD | VSS~VDD/2 |
|---|---|---|
| SEL | 1ST POLARITY SIGNAL | 2ND POLARITY SIGNAL |
| S19, S21 | ON | OFF |
| S20, S22 | OFF | ON |

OPERATIONAL AMPLIFIER, DRIVER AND DISPLAY

INCORPORATION BY REFERENCE

This application claims a priority on convention based on Japanese Patent Application No. 2009-103187. The disclosure thereof is incorporated herein by reference.

TECHNICAL FIELD

The present invention relates to an operational amplifier suitable for an amplifier circuit for a driver used to drive capacitive load such as a liquid crystal panel, and in particular to an operational amplifier in which a low power consumption amount is required.

BACKGROUND ART

The recent trend of thin flat panels is in large size. Especially, in the field of television, even a liquid crystal panel of more than 100 inches in size appears, and it is thought that this trend will remain unchanged in the future. A thin film transistor liquid crystal display (TFT_LCD) panel is provided with data lines. The data lines are driven by amplifiers of an LCD driver. According to increase in size of the liquid crystal display panel, the load of each of the data lines becomes heavier, and thus a power consumption amount in the amplifier tends to increase. Further, in order to reduce the number of LCD drivers to be used, the number of outputs of one chip tends to increase. As a result, the power consumption amount per one chip increases. This causes a problem that the power consumption amount of the whole of LCD drivers increases, resulting in an abnormal elevation in chip temperature.

As a measure against the elevation in chip temperature, a system draws attention, in which an intermediate voltage VDD/2 which is a half of a high-voltage side power supply voltage VDD is supplied to a chip, and an operational amplifier operating in this voltage is used to reduce power consumed by the chip. In accordance with this system, however, various problems in a circuit arise. For example, if the chip is merely driven with the power supply voltage of VDD/2, the voltage range of the operational amplifier is limited, so that a positive side operational amplifier operates in the range from the intermediate voltage VDD/2 to the high-voltage side power supply voltage VDD, and an negative side operational amplifier operates in the range from the low-voltage side power supply voltage VSS (GND) to the intermediate voltage VDD/2. For this reason, a switch needs to be connected to an output of the operational amplifier for polarity inversion. However, the switch is very large in size, causing increase in chip area. Furthermore, there is such a problem that an on-resistance of the switch causes dullness in output waveform.

This problem will be described with reference to an operational amplifier described in patent literature 1 as an example. FIG. 1 shows a configuration of a conventional operational amplifier. The conventional operational amplifier is provided with differential input stage circuits 140 and 240 which are supplied with a high-voltage side power supply voltage VDD and a low-voltage side, power supply voltage VSS, and driving stage circuits 130 and 230, switch circuits 300, 400, 500, and 600, P-channel MOS transistors MP180 and MP280 (hereinafter, to be referred to as "transistors MP180 and MP280"), and N-channel MOS transistors MN180 and MN280 (hereinafter, to be referred to as "transistors MN180 and MN280").

The driving stage circuit 130 is connected to an output terminal 110 via the drains of the transistors MP180 and MN180. Similarly, the driving stage circuit 230 is connected to an output terminal 210 via the drains of the transistors MP280 and MN280. The source of the transistor MP180 is supplied with the high-voltage side power supply voltage VDD, and the source of the transistor MN180 is supplied with an intermediate voltage between the high-voltage side power supply voltage VDD and the low-voltage side power supply voltage VSS, namely, an intermediate voltage VDD/2 which is ½ of the high-voltage side power supply voltage VDD. Further, the source of the transistor MP280 is supplied with the intermediate voltage VDD/2, and the source of the transistor MN280 is supplied with the low-voltage side power supply voltage VSS.

The switch circuit 300 is provided with switches SW301 to SW304 to control connections between the output terminals 110 and 210 and an odd terminal 310 and an even terminal 320. The switch circuit 400 is provided with switches SW401 to SW404 to control connections between terminals 410 and 420 and input terminals 120 and 220 of the differential input stage circuits 140 and 240. Here, a positive-polarity voltage INP is inputted from a positive digital-analog converter (DAC) to the terminal 410, and a negative-polarity voltage INN is inputted from a negative DAC to the terminal 420. The switch circuit 500 is provided with switches SW501 to SW504 to control connections between the differential input stage circuits 140 and 240 and the driving stage circuits 130 and 230. The switch circuit 600 is provided with switches SW601 to SW604 to control connections between the output terminals 110 and 210 and input terminals 121 and 221 of the differential input stage circuits 140 and 240.

The conventional operational amplifier can change the configuration of the operational amplifier circuit, which drives the odd terminal 310 and the even terminal 320, by the switch circuits 300 to 600. Specifically, a pattern 1 in which the switches SW301, SW303, SW401, SW403, SW501, SW503, SW601, and SW603 are set to on states while the switches SW302, SW304, SW402, SW404, SW502, SW504, SW602, and SW604 are set to off states, and a pattern 2 of the switch states opposite to the above-mentioned states are switched.

In a case of the pattern 1, the positive-polarity voltage INP from the positive DAC is inputted to the operational amplifier circuit formed from the differential input stage circuit 140 and the driving stage circuit 130, and an output from the output terminal 110 is outputted to the odd terminal 310 as an odd output Vodd. At this time, the negative-polarity voltage INN from the negative DAC is inputted to an operational amplifier circuit formed from the differential input stage circuit 240 and the driving stage circuit 230, and an output from the output terminal 210 is outputted to the even terminal 320 as an even output Veven.

On the other hand, in the case of the pattern 2, the positive-polarity voltage INP from the positive DAC is inputted to the operational amplifier circuit formed by the differential input stage circuit 240 and the driving stage circuit 130, and an output from the output terminal 110 is outputted to the even terminal 320 as an even output Veven. At this time, the negative-polarity voltage INN from the negative DAC is inputted to the operational amplifier circuit formed from the differential input stage circuit 140 and the driving stage circuit 230, and an output from the output terminal 210 is outputted to the odd terminal 310 as an odd output Vodd.

As described above, the conventional operational amplifier operates in the above-described manner to drive capacitive loads connected to the odd terminal 310 and the even terminal 320. At this time, the differential input stage circuits 140 and 240 and the driving stage circuits 130 and 230 operate within the voltage range from the high-voltage side power supply voltage VDD to the low-voltage side power supply voltage VSS, and the transistor MP180, the transistor MP280, the transistor MN180 and the transistor MN280, which are output transistors, operate within the voltage range from the high-voltage side power supply voltage VDD to the intermediate voltage VDD/2 or the range from the intermediate voltage VDD/2 to the low-voltage side power supply voltage VSS, respectively. Thereby, it is made possible to make power consumed in an output stage about half.

In the conventional operational amplifier, the effect that power consumption amount (especially, static power consumption amount) is reduced to about half is provided by such power supply connections as shown in FIG. 1. In the conventional operational amplifier, however, it is required to provide the switches for the polarity inversion on the output side of the output stage, as shown in FIG. 1. FIG. 2 is a diagram showing output waveforms simulated by using the sizes of the switches SW301 to SW304 as parameters in FIG. 1. As shown in FIG. 2, the characteristic varies greatly according to the sizes of the switches SW301 to SW304. When the sizes of the switches SW301 to SW304 are small, that is, when on resistances of the switches are large, the output waveform is dull. If such an operational amplifier is used for a driving amplifier of a liquid crystal display panel, insufficient writing into a liquid crystal pixel capacitor is generated, which causes image degradation. Therefore, it is required to increase the sizes of the switches in order to improve the characteristic. As a result, the size of the chip is increased, leading to cost rise.

CITATION LIST

Patent literature 1: JP 2002-175052A

SUMMARY OF THE INVENTION

In an aspect of the present invention, an operational amplifier includes an input differential stage having one external input receiving an external input voltage and two outputs; and two output stages. A switch section is provided between inputs of the two output stages and the two outputs of the input differential stage, and is configured to alternately connect the two outputs of the input differential stage and inputs of a positive-only output stage of the two output stages; and the two outputs of the input differential stage and inputs of a negative-only output stage of the two output stages.

In another aspect of the present invention, a driver includes an output section configured to output an output gradation voltage based on display data; and an operational amplifier configured to receive the output gradation voltage as an external input voltage to output on a data line through the output node. The operational amplifier includes an input differential stage having one external input receiving an external input voltage and two outputs; two output stages; and a switch section provided between inputs of the two output stages and the two outputs of the input differential stage, and configured to alternately connect the two outputs of the input differential stage and inputs of a positive-only output stage of the two output stages; and the two outputs of the input differential stage and inputs of a negative-only output stage of the two output stages.

In still another aspect of the present invention, a display includes a display section having a data line; and a driver connected with the data line. The driver includes an output section configured to output an output gradation voltage based on display data; and an operational amplifier configured to receive the output gradation voltage as an external input voltage to output on a data line through the output node. The operational amplifier includes an input differential stage having one external input receiving an external input voltage and two outputs; two output stages; and a switch section provided between inputs of the two output stages and the two outputs of the input differential stage, and configured to alternately connect the two outputs of the input differential stage and inputs of a positive-only output stage of the two output stages; and the two outputs of the input differential stage and inputs of a negative-only output stage of the two output stages.

In the operational amplifier according to the present invention, switches for polarity inversion are not provided on the output side of the output stage. Instead, switches sections are provided between two outputs of an input differential stage and inputs of two output stages (positive-only output stage negative-only output stage). Connection between a first output of the input differential stage and the input of the positive-only output stage and connection between a second output of the input differential stage and the input of the negative-only output stage are alternately switched by switch sections. Therefore, a power consumption amount can be made about half without increasing the sizes of switches.

BRIEF DESCRIPTION OF THE DRAWINGS

The above and other objects, advantages and features of the present invention will be more apparent from the following description of certain embodiments taken in conjunction with the accompanying drawings, in which:

FIG. 16 shows timing charts in the switching operation of the example 1 of the operational amplifier according to the third embodiment and the fourth embodiment of the present invention;

FIG. 17 shows timing charts in the switching operation of the example 2 of the operational amplifier according to the third embodiment and the fourth embodiment of the present invention;

DESCRIPTION OF EMBODIMENTS

Hereinafter, a thin film transistor (TFT) liquid crystal display apparatus to which an operational amplifier according to the present invention is applied will be described in detail with reference to the drawings appended.

Figure 1:
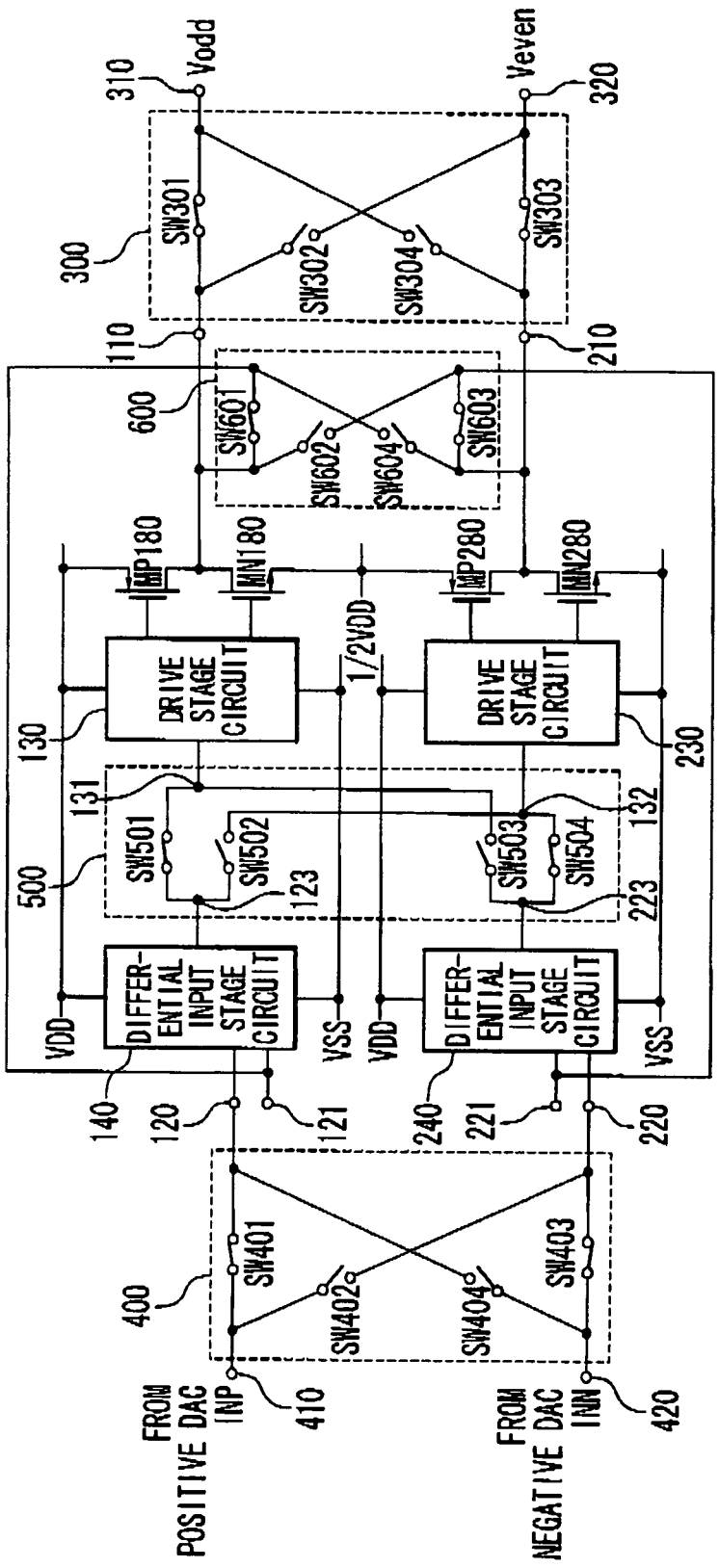
FIG. 1 shows a configuration of a conventional operational amplifier.
Figure 2:
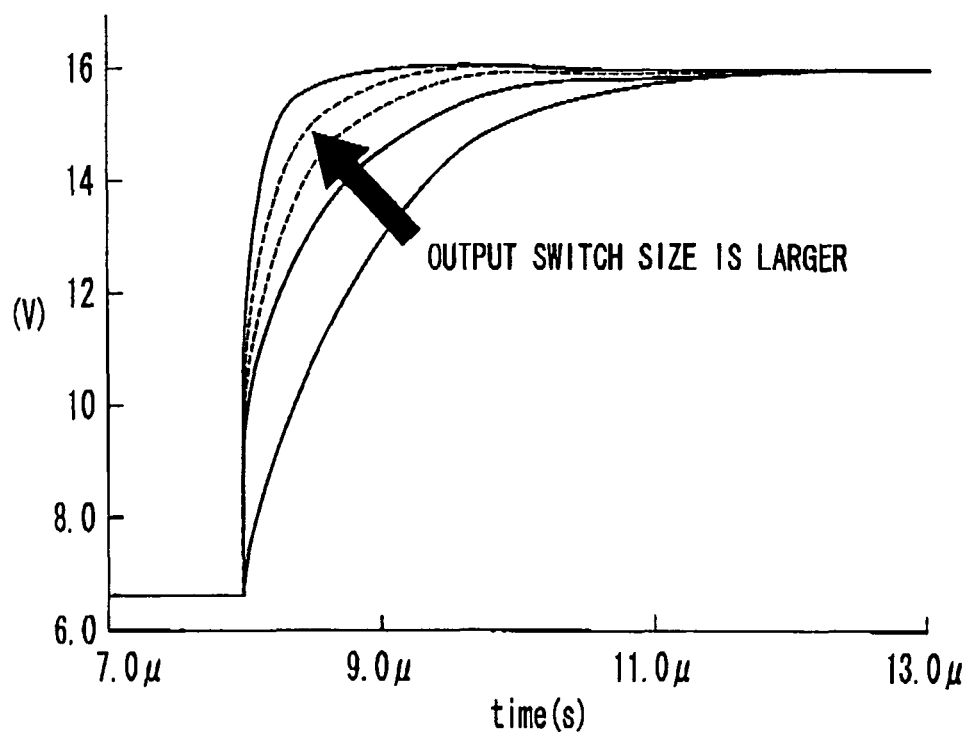
FIG. 2 shows a dependency of output waveform on switch size in an LCD driver output.
Figure 3:
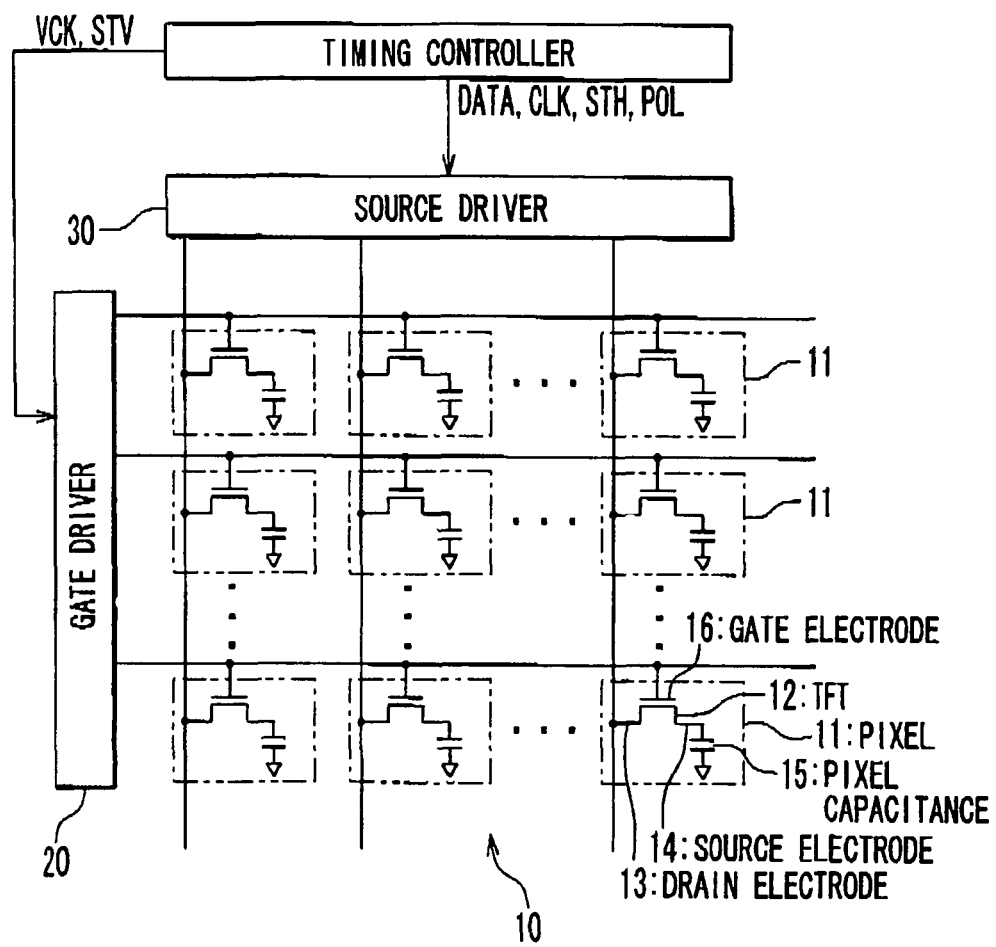
FIG. 3 shows a configuration of a TFT liquid crystal display apparatus to which an operational amplifier according to the present invention is applied.

FIG. 3 shows a configuration of the TFT liquid crystal display apparatus in which the operational amplifier according to an embodiment of the present invention is applied. The TFT liquid crystal display apparatus is provided with a display section (liquid crystal display panel) 10 which is a liquid crystal display (LCD) module. The liquid crystal display panel 10 is provided with a plurality of pixels 11 arranged in a matrix. Each of the plurality of pixels 11 is provided with a thin film transistor (TFT) 12 and a pixel capacitor 15. The pixel capacitor 15 is provided with a pixel electrode and a counter electrode opposite to the pixel electrode. The TFT 12 is provided with a drain electrode 13, a source electrode 14 connected to the pixel electrode, and a gate electrode 16.

The TFT liquid crystal display apparatus is further provided with a gate driver 20 and a source driver 30 as drivers to drive the plurality of pixels 11 of the liquid crystal display panel 10. The gate driver 20 and the source driver 30 are provided on the panel in this example. The TFT liquid crystal display apparatus is further provided with a plurality of gate lines connected to the gate driver 20 and a plurality of data lines connected to the source driver 30. Each of the plurality of gate lines is connected with the gate electrodes 16 of the TFTs 12 of the pixels 11 arranged in one row. Each of the plurality of data lines is connected with the drain electrodes 13 of the TFTs 12 of the pixels 11 arranged in one column.

The TFT liquid crystal display apparatus is further provided with a timing controller. The timing controller outputs to a gate driver 20, a vertical clock signal VCK, and a vertical shift pulse signal STV so as to sequentially select the plurality of gate lines from the first to the last. For example, it is assumed that the gate driver 20 select one of the plurality of gate lines in response to the vertical shift pulse signal STV and the vertical clock signal VCK. In this case, a selection signal is outputted to one gate line. The selection signal is supplied to the gate electrodes 16 of the TFTs 12 of the pixels 11 for one line corresponding to the one gate line. The same is applied to the other gate lines.

The timing controller outputs to the source driver 30 display data DATA for one frame, a clock signal CLK, and a shift pulse signal STH. The display data DATA for one frame includes display data for the lines from the first line to the last line. The display data for one line includes a plurality of display data respectively corresponding to the plurality of data lines. The source driver 30 respectively outputs the plurality of display data to the plurality of data lines in response to the shift pulse signal STH and the clock signal CLK. At this time, the TFTs 12 of the pixels 11 related to one gate line of the plurality of gate lines and the plurality of data lines are turned on. Therefore, the plurality of display data are respectively written in the pixel capacitors 15 of the pixels 11, and they are held until the next writing. Thereby, the display data DATA for one line is displayed.

Figure 4:
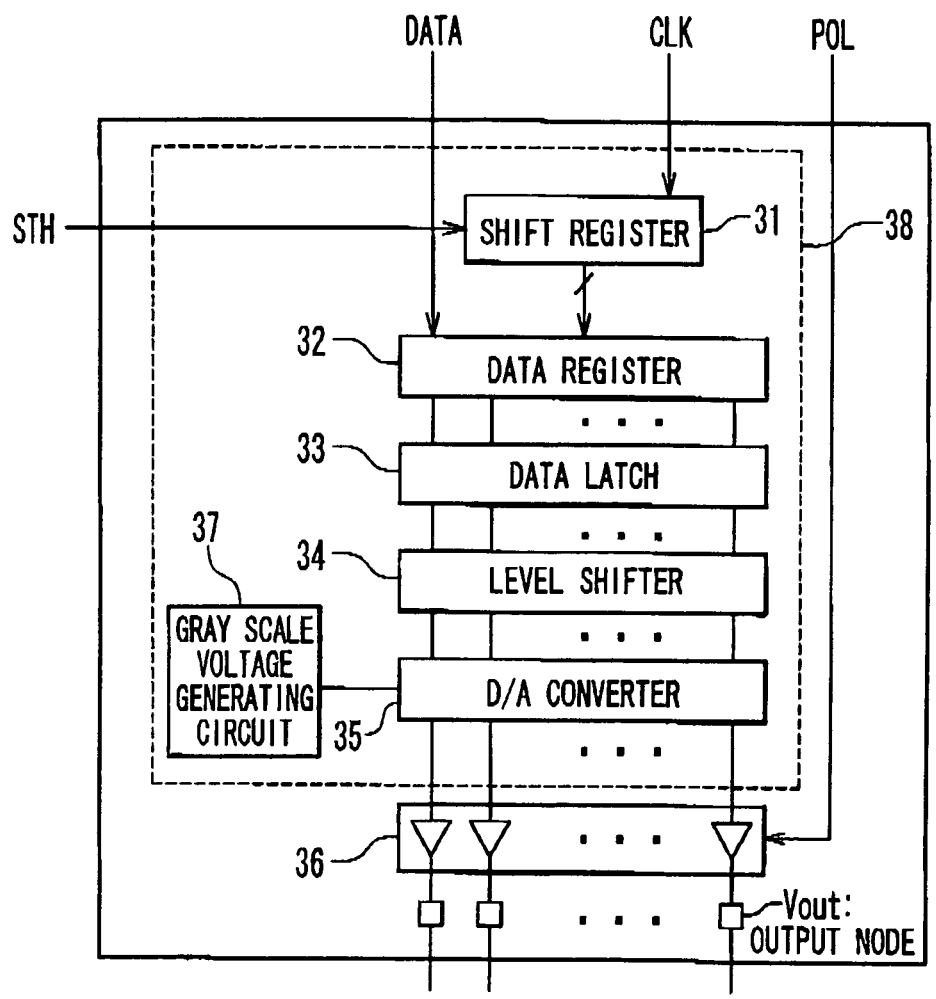
FIG. 4 shows a configuration of a source driver 30 shown in FIG. 3.

FIG. 4 shows a configuration of the source driver 30. The source driver 30 is provided with an output section and an output amplifier circuit 36. The output section is provided with a shift register circuit 31, a data register circuit 32, a data latch circuit 33, a level shifter circuit 34, a D/A converter circuit 35, a gradation voltage generating circuit 37, and a plurality of output nodes Vout. The plurality of output nodes Vout are respectively connected to the plurality of data lines.

The gradation voltage generating circuit 37 is provided with gradation resistance elements connected in series. The gradation voltage generating circuit 37 generates a plurality of gradation voltages by dividing a reference voltage from a power supply circuit (not shown) by the gradation resistance elements. The shift register circuit 31 sequentially shifts the shift pulse signal STH in synchronization with the clock signal CLK to output the shift pulse signal STH to the data register 32. The data register circuit 32 receives the plurality of display data from the timing controller in synchronization with the shift pulse signal STH from the shift register circuit 31 and outputs the same to the data latch circuit 33.

The data latch circuit 33 is provided with a plurality of data latches. The plurality of data latches latch the plurality of display data at the same timing, and outputs the same to the level shifter 34, respectively. The level shifter circuit 34 is provided with a plurality of level shifters. The plurality of level shifters perform level conversion of the plurality of display data from the data latch circuit 33, and outputs the same to the D/A converter 35, respectively. The D/A converter circuit 35 is provided with a plurality of D/A converters. The plurality of D/A converters perform digital-to-analog conversion of the plurality of display data from the level shifter circuit 34, respectively. That is, each of the plurality of D/A converters selects an output gradation voltage corresponding to the display data from the plurality of gradation voltages, and outputs the same to the output amplifier circuit 36. The output amplifier circuit 36 is provided with a plurality of amplifiers which are operational amplifiers according to an embodiment of the present invention. Outputs of the plurality of amplifiers are connected to the plurality of data lines via the plurality of output nodes Vout, respectively. The plurality of amplifiers outputs output gradation voltages to the plurality of data lines in response to a polarity signal POL, respectively.

First Embodiment

Figure 5:
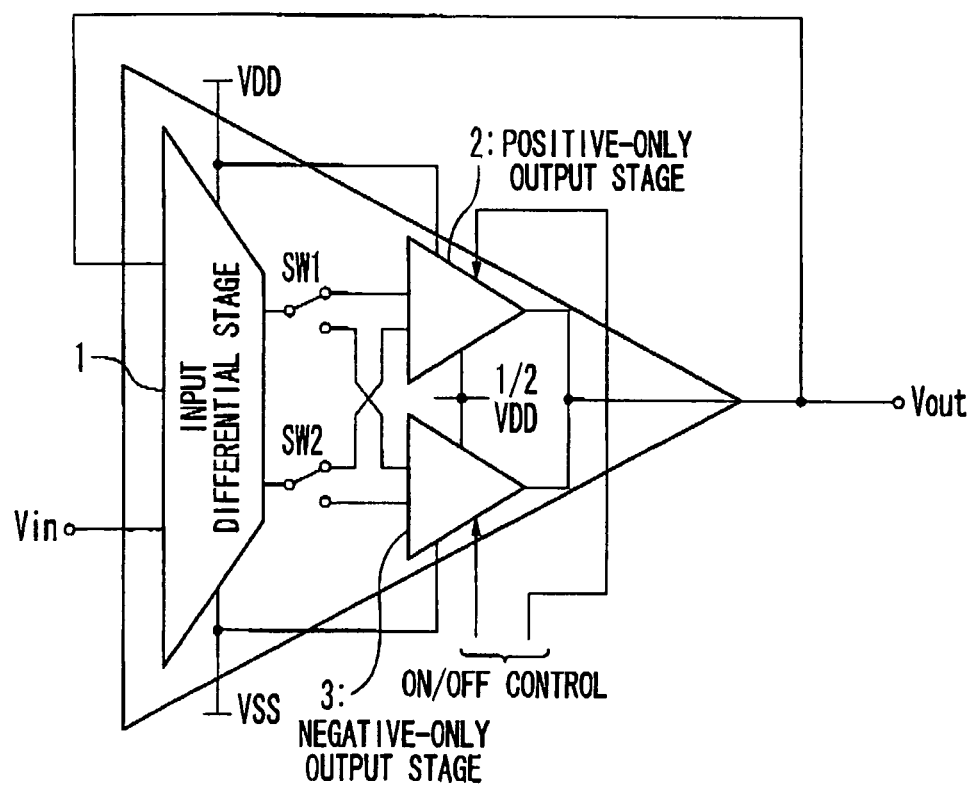
FIG. 5 shows a configuration of the operational amplifier according to a first embodiment of the present invention.

FIG. 5 shows a configuration of an operational amplifier according to a first embodiment of the present invention. The operational amplifier according to the first embodiment of the present invention is provided with an input differential stage 1 having one input and two outputs, two output stages 2 and 3, and switch sections SW1 and SW2.

The switch sections SW1 and SW2 are respectively provided between inputs of the two output stages 2 and 3 and two outputs of the input differential stage 1. The switch sections SW1 and SW2 alternately perform connection between a first output of the two outputs of the input differential stage 1 and a positive-only output stage 2 of the two output stages 2 and 3 and connection between a second output of the two outputs of the input differential stage 1 and a negative-only output stage 3 of the two output stages 2 and 3.

The input differential stage 1 operates with a voltage between a high-voltage side power supply voltage VDD and a low-voltage side power supply voltage VSS which is lower than the high-voltage side power supply voltage VDD. The input differential stage 1 outputs a difference between an input voltage (output gradation voltage) supplied to an input node Vin from the D/A converter and a voltage supplied to an output node Vout.

The positive-only output stage 2 operates with a voltage between a first voltage (first power supply voltage) and the high-voltage side power supply voltage VDD. The positive-only output stage 2 amplifies a current corresponding to the first output of the input differential stage 1, and outputs the same to the output node Vout. An output of the negative-only output stage 3 is connected to an output of the positive-only output stage 2. The negative-only output stage 3 operates with a voltage between the low-voltage side power supply voltage VSS and a second voltage (second power supply voltage). The negative-only output stage 3 amplifies a current corresponding to a second output of the input differential stage 1 and outputs the same to the output node Vout.

The first and second voltages are voltages between the high-voltage side power supply voltage VDD and the low-voltage side power supply voltage VSS. For example, the first and second voltages represent intermediate voltages between the high-voltage side power supply voltage VDD and the low-voltage side power supply voltage VSS. The intermediate voltage may not necessarily be an intermediate voltage VDD/2 between the high-voltage side power supply voltage VDD and the low-voltage side power supply voltage VSS, and may include a small percent of error.

Referring to FIG. 5, the operation of the operational amplifier according to the first embodiment of the present invention will be described. The timing controller supplies a first polarity signal and a second polarity signal alternately as the above polarity signal to the switch sections SW1 and SW2 for each scanning line or for each frame.

First, the switch sections SW1 and SW2 connect the first output of the input differential stage 1 and the input of the positive-only output stage 2 in response to the first polarity signal. At this time, the output of the negative-only output stage 3 is set to a high impedance state in response to the first polarity signal (described later). Thereby, the operational amplifier according to the first embodiment of the present invention is configured from the input differential stage 1 and the positive-only output stage 2.

Next, the switch sections SW1 and SW2 connect the second output of the input differential stage 1 and the input of the positive-only output stage 3 in response to the second polarity signal. At this time, the output of the positive-only output stage 2 is set to a high impedance state in response to the second polarity signal (described later). Thereby, the operational amplifier according to the first embodiment of the present invention is configured from the input differential stage 1 and the negative-only output stage 3.

Thus, since the outputs of the positive-only output stage 2 and the negative-only output stage 3 are connected to the input differential stage 1 via the output node Vout to build a voltage follower connection, an input voltage supplied to the input node Vin and a voltage supplied to the output node Vout are equal to each other, and when the respective voltages are denoted by Vin and Vout, the following equation is obtained:

$$Vout = Vin$$

In the operational amplifier according to the first embodiment of the present invention, a switch for polarity inversion is not provided on the output side of an output stage, but the above switch sections SW1 and SW2 are provided between the two outputs of the input differential stage 1 and the inputs of the two output stages (positive-only output stage 2 and the negative-only output stage 3). The connection between the first output of the input differential stage 1 and the input of the positive-only output stage 2 and the connection between the second output of the input differential stage 1 and the input of the negative-only output stage 3 are alternately performed by the switch sections SW1 and SW2. Therefore, a power consumption amount can be made about half without increase in switch size.

The input differential stage 1 operates with a voltage between the low-voltage side power supply voltage VSS (GND) and the high-voltage side power supply voltage VDD. Therefore, regardless of which the positive-only output stage 2 and the negative-only output stage 3 is selected, the input differential stage 1 operates normally in the full input voltage range (VSS (GND) to VDD). Here, the current value of the input differential stage 1 is generally small, and even if a power supply voltage supplied to the input differential stage 1 is high, power consumed by the input differential stage 1 is of a negligible level, as compared with those consumed in the output stages. Therefore, the degree of influence on the power consumption amount as a whole is low.

According to the operational amplifier according to the first embodiment of the present invention, the two output stages are limited in an output voltage range since their power supply voltages are limited, but switching between the positive-only output stage 2 and the negative-only output stage 3 according to the output voltage range results in a normal operation in the full output voltage range (VSS (GND) to VDD). Here, a current flowing through the output stage is a summation of an idling current which is several times as large as a current flowing through the input differential stage and a current flowing through an output load, which generally accounts for about 80% or more of the whole current consumption amount. Therefore, it is sufficiently effective to cause only the output stages to operate with a half voltage (VDD/2) of the normal power supply voltage.

Example 1 in First Embodiment

Figure 6:
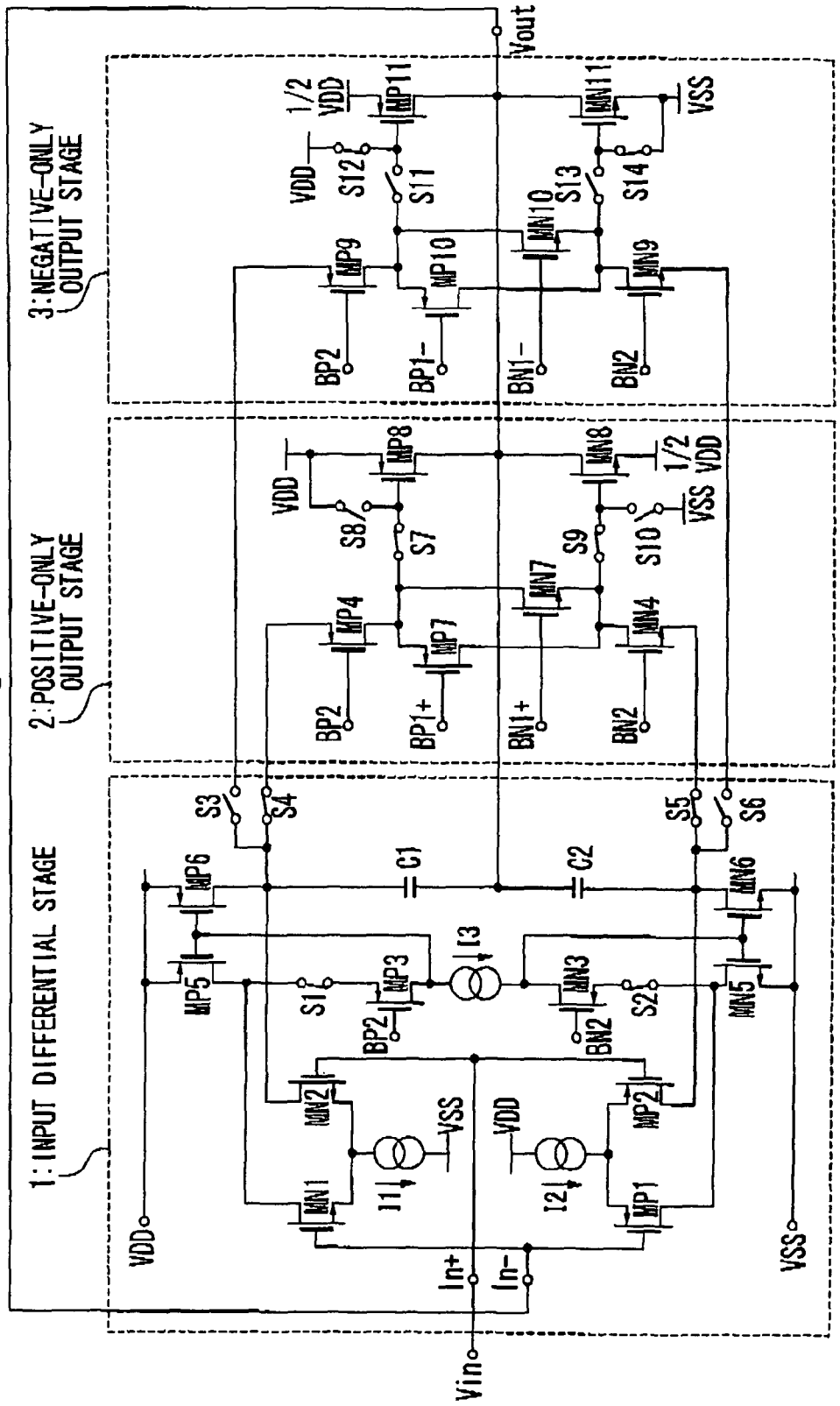
FIG. 6 shows an example 1 of the operational amplifier according to the first embodiment of the present invention.

FIG. 6 shows an example 1 of the operational amplifier according to the first embodiment of the present invention. The input differential stage 1 is provided with first to third, fifth and sixth N-channel metal, oxide semiconductor (MOS) transistors MN1, MN2, MN3, MN5, and MN6 (hereinafter, to be referred to as transistors MN1, MN2, MN3, MN5, and MN6), first to third constant current sources I1, I2, and I3 (hereinafter, to be referred to as constant current sources I1, I2, and I3), first to third, fifth and sixth. P-channel MOS transistors MP1, MP2, MP3 MP5, and MP6 (hereinafter, to be referred to as transistors MP1, MP2, MP3, MP5, and MP6), and first and second capacitors C1 and C2 (hereinafter, to be referred to as capacitors C1 and C2). The switch section SW1 is provided with third and fourth switches S3 and S4 (hereinafter, to be referred to as switches S3 and S4), and the switch section SW2 is provided with fifth and sixth switches S5 and S6 (hereinafter, to be referred to as switches S5 and S6).

The transistors MN1 and MN2 configure an N-channel differential pair, and their sources are connected to each other. The constant current source I1 is provided between the sources of the transistors MN1 and MN2 and the low-voltage side power supply voltage VSS. The transistors MP1 and MP2 configure a P-channel differential pair. The gates of the transistors MP1 and MP2 are connected to the gates of the transistors MN1 and MN2, and the sources thereof are connected to each other, The constant current source I2 is provided between the sources of the transistors MP1 and MP2 and the high-voltage side power supply voltage VDD.

The transistors MP5 and MP6 are of a folded cascode type and serve as an active load of the N-channel differential pair. The sources of the transistors MP5 and MP6 are connected to the high-voltage side power supply voltage VDD, and the gates thereof are connected to each other. The drains of the transistors MP5 and MP6 are connected to the drains of the transistors MN1 and MN2, respectively. The transistors MN5 and MN6 are of a folded cascode type and serve as an active load of the P-channel differential pair. The sources of the transistors MN5 and MN6 are connected to the low-voltage side power supply voltage VSS, and the gates thereof are connected to each other. The drains of the transistors MN5 and MN6 are connected to the drains of the transistors MP1 and MP2, respectively.

The transistor MP3 configures a folded cascode. The source of the transistor MP3 is connected to the drain of the transistor MP5, the gate thereof is connected to a first constant voltage source which supplies a first bias voltage BP2 (hereinafter, to be referred to as a bias voltage BP2), and the drain thereof is connected to the gates of the transistors MP5 and MP6. The transistor MN3 configures a folded cascode. The source of the transistor MN3 is connected to the drain of the transistor MN5, the gate thereof is connected to a second constant voltage source which supplies a second bias voltage BN2 (hereinafter, to be referred to as a bias voltage BN2), and the drain thereof is connected to the gates of the transistors MN5 and MN6.

The constant current source I3 is provided between the drain of the transistor MP3 and the drain of the transistor MN3. The capacitor C1 is connected between the drain of the transistor MP6 and the output node Vout. The capacitor C2 is connected between the drain of the transistor MN6 and the output node Vout.

One end of the switch S4 is connected to the drain of the transistor MP6, and the other end thereof is connected to an input of the positive-only output stage 2. One end of the switch S3 is connected to the drain of the transistor MP6, and the other end thereof is connected to an input of the negative-only output stage 3. One end of the switch S5 is connected to the drain of the transistor MN6, and the other end thereof is connected to an input of the positive-only output stage 2. One end of the switch S6 is connected to the drain of the transistor MN6, and the other end thereof is connected to an input of the negative-only output stage 3.

The gate of the transistor MN2 and the gate of the transistor MP2 are used as a first input node In+ of the input differential stage 1, and an input voltage is supplied to the first input node In+. The gate of the transistor MN1 and the gate of the transistor MP1 are used as a second input node In− of the input differential stage 1, and the second input node In− is connected to the output node Vout for voltage follower connection.

The positive-only output stage 2 is provided with fourth, seventh and eighth P-channel MOS transistors MP4, MP7, MP8 (hereinafter, to be referred to as transistors MP4, MP7, and MP8), fourth, seventh and eighth N-channel MOS transistors MN4, MN7, and MN8 (hereinafter, to be referred to as transistors MN4, MN7, and MN8), and seventh to tenth switches S7, S8, S9, and S10 (hereinafter, to be referred to as switches S7, S8, S9, and S10).

A source of the transistor MP4 is connected to the other end of the switch S4, and a gate thereof is connected to a constant voltage BP2. A source of the transistor MN4 is connected to the other end of the switch 35, and a gate thereof is connected to a constant voltage BN2. A source of the transistor MP7 is connected to a drain of the transistor MP4, a drain thereof is connected to the drain of the transistor MN4, and a gate thereof is connected to a third constant voltage BP1+ (hereinafter, to be referred to as a constant voltage BP1+). A source of the transistor MN7 is connected to the drain of the transistor MN4, a drain thereof is connected to the drain of the transistor MP4, and a gate thereof is connected to a fourth constant voltage BN1+ (hereinafter, to be referred to as a constant voltage BN1+).

One end of the switch S7 is connected to the drain of the transistor MP4. One end of the switch S8 is connected to the other end of the switch S7, and the other end thereof is connected to the high-voltage side power supply voltage VDD. One end of the switch S9 is connected to the drain of the transistor MN4. One end of the switch S10 is connected to the other end of the switch S9, and the other end thereof is connected to the low-voltage side power supply voltage VSS. A gate of the transistor MP8 is connected to the other end of the switch S7 and the one end of the switch S8, a source thereof is connected to the high-voltage side power supply voltage VDD, and a drain thereof is connected to the output node Vout. A gate of the transistor MN8 is connected to the other end of the switch S9 and the one end of the switch S10, a source thereof is connected to the first power supply voltage VDD/2, and a drain thereof is connected to the output node Vout.

The negative-only output stage 3 is provided with ninth, tenth and eleventh P-channel MOS transistors MP9, MP10, MP11 (hereinafter, to be referred to as transistors MP9, MP10, and MP11), ninth, tenth and eleventh N-channel MOS transistors MN9, MN10, and MN11 (hereinafter, to be referred to as transistors MN9, MN10, and MN11), and eleventh to fourteenth switches S11, 512, S13, and S14 (hereinafter, to be referred to as switches S11, S12, 513, and S14).

A source of the transistor MP9 is connected to the other end of the switch S3, and a gate thereof is connected to a constant voltage BP2. A source of the transistor MN9 is connected to the other end of the switch S6, and a gate thereof is connected to a constant voltage BN2. A source of the transistor MP10 is connected to the drain of the transistor MP9, a drain thereof is connected to the drain of the transistor MN9, and the gate thereof is connected to a fifth constant voltage BP1− (hereinafter, to be referred to as a constant voltage BP1−. A source of the transistor MN10 is connected to the drain of the transistor MN9, a drain thereof is connected to the drain of the transistor MP9, and a gate thereof is connected to a sixth constant voltage BN1− (hereinafter, to be referred to as a constant voltage BN1−).

One end of the switch 511 is connected to the drain of the transistor MP9. One end of the switch S12 is connected to the other end of the switch S11, and the other end thereof is connected to the high-voltage side power supply voltage VDD. One end of the switch S13 is connected to the drain of the transistor MN9. One end of the switch S14 is connected to the other end of the switch S13, and the other end thereof is connected to the low-voltage side power supply voltage VSS. A gate of the transistor MP11 is connected to the other end of the switch S11 and one end of the switch S12, a source thereof is connected to the second power supply voltage VDD/2, and a drain thereof is connected to the output node Vout. A gate of the transistor MN11 is connected to the other end of the switch S13 and one end of the switch S14, a source thereof is connected to the low-voltage side power supply voltage VSS, and a drain thereof is connected to the output node Vout.

Figure 8:
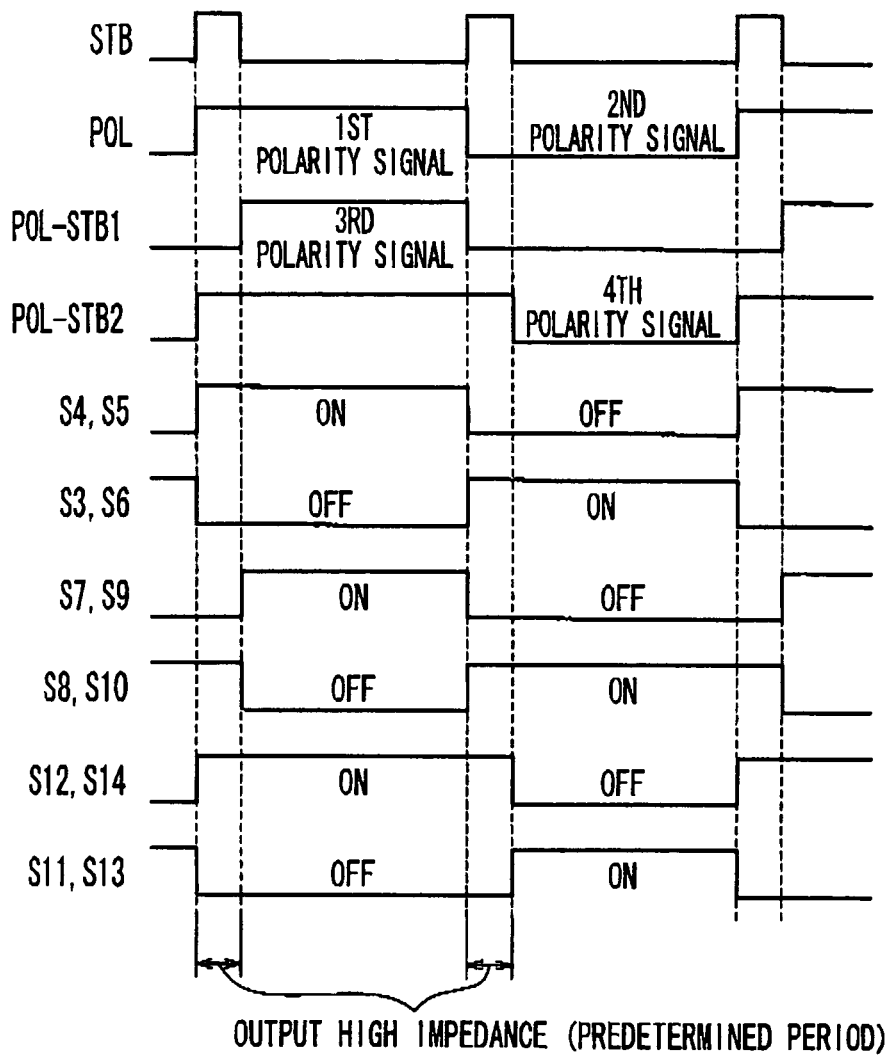
FIG. 8 shows timing charts in a switching operation of the examples 1 and 2 of the operational amplifier according to the first embodiment to a fourth embodiment of the present invention.

FIG. 8 shows timing charts in the operation of the example 1 of the operational amplifier according to the first embodiment of the present invention.

First, signals supplied to the switches S3, S4, and S5 to S14 will be described. The timing controller supplies the first polarity signal and the second polarity signal alternately as the polarity signal POL to the switch section SW1 (switches S3 and S4), the switch section SW2 (switches S5 and S6), the positive-only output stage 2 (switches S7 to S10), and the negative-only output stage 3 (switches S11 to S14) for each scanning line or for each frame. Here, since the first polarity signal is a signal when the polarity signal POL is in the high level, the first polarity signal is referred to as a first polarity signal POL "High". Since the second polarity signal is a signal when the polarity signal POL is in the low level, the second polarity signal is referred to as a second polarity signal POL "Low".

In addition, the timing controller generates a one-shot pulse signal STB at the timing of switching the first polarity signal POL "High" and the second polarity signal POL "Low". Here, since the one-shot pulse signal STB is a signal when the one-shot pulse signal STB is in the high level, the one-shot pulse signal STB is referred to as a one-shot pulse signal STB "High". A period for which the one-shot pulse signal STB "High" is supplied is referred to as a predetermined period STB "High"

The timing controller further supplies a third polarity signal POL-STB1 to the positive-only output stage 2 (switches S7 to S10). Here, the third polarity signal POL-STB1 is in the high level for a period of the first polarity signal POL "High" in the high level other than the predetermined period STB "High" and is in the low level for a remaining period. Thus, the third polarity signal POL-STB1 is referred to as a third polarity signal POL-STB1 "High".

The timing controller further supplies a fourth polarity signal POL-STB2 to the negative-only output stage 3 (switches S11 to S14). Here, the fourth polarity signal POL-STB2 is in the low level for a period of the second polarity signal POL "Low" in the low level other than the predetermined period STB "High", and in the high level for a remaining period. Thus, the fourth polarity signal POL-STB2 is referred to as a fourth polarity signal POL-STB2 "Low".

Next, the operations of the switches S3 to S14 will be described.

First, the timing controller outputs the first polarity signal POL "High" for a certain scanning line or frame, and simultaneously outputs the one-shot pulse signal STB "High", an inversion signal of the third polarity signal POL-STB1 "High", and an inversion signal of the fourth polarity signal POL-STB2 "Low". In this case, the switches S4 and S5 are turned on in response to the first polarity signal POL "High", and the switches S3 and S6 are turned off in response to the first polarity signal POL "High". The switches S7 and S9 are turned off in response to the inversion signal of the third polarity signal POL-STB1 "High", and the switches S8 and S10 are turned on in response to the inversion signal of the third polarity signal POL-STB1 "High". The switches S12 and S14 are turned on in response to the inversion signal of the fourth polarity signal POL-STB2 "Low", and the switches S11 and S13 are turned off in response to the inversion signal of the fourth polarity signal POL-STB2 "Low". At this time, since the switches 511 and S13 are off, the output of the negative-only output stage 3 is high-impedance.

Next, the timing controller inverts the polarity of the one-shot pulse signal STB "High" to output the third polarity signal POL-STB1 "High" while outputting the first polarity signal POL "High" and the fourth polarity signal POL-STB2 "Low". The switches S7 and S9 are turned on in response to the third polarity signal POL-STB1 "High", and the switches S8 and S10 are turned off in response to the third polarity signal POL-STB1 "High".

The timing controller outputs the second polarity signal POL "Low" for a next scanning line or frame, to simultaneously output the one-shot pulse signal STB "High", and the inversion signal of the third polarity signal POL-STB1 "High", while outputting the inversion signal of the fourth polarity signal POL-STB2 "Low". In this case, the switches S4 and S5 are turned off in response to the second polarity signal POL "Low", and the switches S3 and S6 are turned on in response to the second polarity signal POL "Low". The switches S7 and S9 are turned off in response to the inversion signal of the third polarity signal POL-STB1 "High", and the switches S8 and S10 are turned on in response to the inversion signal of the third polarity signal POL-STB1 "High". At this time, since the switches S7 and S9 are turned off, the output of the positive-only output stage 2 is high-impedance.

Next, the timing controller inverts the polarity of the one-shot pulse signal STB "High" and outputs the fourth polarity signal POL-STB2 "Low" while outputting the second polarity signal POL "Low" and the inversion signal of the third polarity signal POL-STB1 "High". The switches S12 and S14 are turned off in response to the fourth polarity signal POL-STB2 "Low", and the switches S11 and S13 are turned on in response to the fourth polarity signal POL-STB2 "Low".

Figure 9:
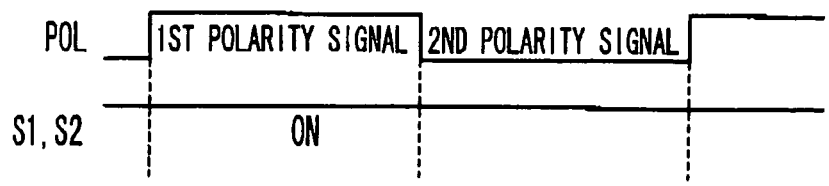
FIG. 9 shows timing charts in the switching operation of the example 1 of the operational amplifier according to the first embodiment and the second embodiment of the present invention.

Here, as shown in FIG. 6, the input differential stage 1 may further be provided with a first switch S1 (hereinafter, to be referred to as a switch S1) and a second switch S2 (hereinafter, to be referred to as a switch S4). The switch 51 is provided between the drain of the transistor MP5 and the source of the transistor MP3. The switch S2 is provided between the drain of the transistor MN5 and the source of the transistor MN3. In this case, as shown in FIG. 9, the switches S1 and S4 are constantly in on-states.

Here, the example 1 of the operational amplifier according to the first embodiment of the present invention will be described.

First, the input differential stage 1 realizes an input rail-to-rail characteristic (in which the input voltage can range from the low-voltage side power supply voltage VSS (GND) to the high-voltage side power supply voltage VDD) through adoption of the configuration in which the N-channel differential pair and the P-channel differential pair are combined. A bias current of the N-channel differential pair is determined by the constant current source I1, and bias current of the P-channel differential pair is determined by the constant current source I2. A slew rate (SR) characteristic is determined based on these values of the constant current sources. However, the SR characteristic relates to the values of phase compensation capacitances C1/C2, the following equation is obtained:

$$SR=I1/C1=I2/C2$$

AT this time, the value of a constant current source I3 (floating constant current source I3) determines a folded-differential idling current and typically sets the value of the current such that I3>I1 and I3>I2 are satisfied. Further, the floating constant current source I3 can be realized by such a circuit configuration as the transistors MP7 and MN7 or the transistors MP10 and MN10 as the floating constant current source to be described later (see FIG. 21). Of signals converted and outputted to a single end of the input differential stage 1, a signal on the P-channel side is outputted to the switches S3 and S4, and a signal on the N-channel side is outputted to the one ends of the switches S5 and S6.

In the positive-only output stage 2, a part of the folded cascade transistors (i.e. transistor MP4 and MN4) is adopted to receive the outputs of the input differential stage 1 via the switches S4 and S5, and outputs to the floating current sources configured by the transistors MP7 and MN7. One feature of the positive-only output stage 2 is in that, sections other than the switches operate with the high-voltage side power supply voltage VDD as a positive power supply voltage and the intermediate voltage VDD/2 as a negative power supply voltage. Thereby, power amount consumed in the output stage is reduced to approximately half.

Here, the operation at the floating current source will be described. The transistors MN7 and MP7 configure a so-called "floating current source". A current source configured by ordinary transistors is connected at its one end to the power supply terminal or the GND terminal, but the both ends of the "floating current source" is in floating states, so that they can freely be connected to anywhere. The current feedback of "1" is locally applied in the connection between the transistor MN7 and the transistor MP7, and the connection point between the source of the transistor MN7 and the drain of the transistor MP7 and the connection point between the drain of the transistor MN7 and the transistor MP7 have high impedance due to the effect of the feedback. From this, the fact that the floating current source is configured could be understood.

The bias design of the floating current source will be described. First, when a voltage (bias voltage BN1+) between the first voltage VDD/2 and the constant voltage BN1+ is denoted by V(BN1+), the voltage V(BN1+) is equal to a summation of a voltage between the gate and the source of the transistor MN8 and a voltage between the gate and the source of the transistor MN7, and therefore the following equation is obtained:

$$V(BN1+)=VGS(MN7)+VGS(MN8)$$

Here, VGS(MN7) denotes the voltage between the gate and the source of the transistor MN7, and VGS(MN8) denotes the voltage between the gate and the source of the transistor MN8.

A voltage VGS between the gate and the source of a MOS transistor is expressed by the equation 1. In the equation 1, β, γ and C0 are expressed by the equations 2, 3 and 4, respectively.

$$VGS = \sqrt{\frac{2 \times ID}{\beta}} + VT0 + \gamma \times \sqrt{VB} \quad (1)$$

$$\beta = \frac{W}{L} \times \mu \times C0 \quad (2)$$

$$\gamma = \frac{\sqrt{2 \times \varepsilon0 \times \varepsilon s \times q \times NA}}{C0} \quad (3)$$

$$C0 = \frac{\varepsilon0 \times \varepsilon s}{t0} \quad (4)$$

Here, W denotes a gate width, L denotes a gate length, μ denotes mobility, C0 denotes a gate oxide film capacitance per unit area, VT0 denotes a threshold at VB=0 V, VB denotes a back gate voltage, ∈0 denotes a dielectric constant in free space ($8.86 \times 10^{-14}$ F/cm), ∈s denotes a relative dielectric constant of a semiconductor (3.9), q denotes the amount of electric charge ($1.6 \times 10^{-12}$ coulomb), t0 denotes a gate oxide film thickness, NA denotes an acceptor density, γ is a value varying according to the process, and an average value thereof is about 0.5.

From the equation of the above V(BN1+) and the equation 2, the voltage V(BN1+) (namely, bias voltage BN1+) is determined so as to obtain a desired drain current (ID). At this time, a circuit for generating the bias voltage BN1+ is ordinarily configured from transistors in order to suppress fluctuation in bias current due to fluctuation in threshold value VT of the transistors (not shown).

Then, the drain of the transistor MP4 and the drain of the transistor MN4 form composite outputs, and the outputs are supplied to the gates of the transistors MP8 and MN8 via the switch S7 and S9, respectively. The drains of the output transistors MP8 and MN8 correspond to a final output. Here, in order to set the output of the positive-only output stage 2 to a high-impedance state, it is only necessary to close the switches S8 and S10 and open the switches S7 and S9.

The negative-only output stage 3 has a same circuit configuration as the positive-only output stage 2. A difference between them is in source voltages of the output transistors. That is, the transistor MP11 is different from the transistor MP8 of the positive-only output stage 2 in that the source thereof is connected to the second power supply voltage VDD/2. Similarly, the transistor MN11 is different from the transistor MN8 of the positive-only output stage 2 in that the source thereof is connected to the low-voltage side power supply voltage VSS. The remaining portion of the configuration of the negative-only output stage 3 is the same as that of the positive-only output stage 2. However, since the bias voltage BP1/BN1 of the floating current source need to be changed according to the source voltages of the output transistors, the constant bias voltages BP1+ and BN1+ of the positive-only output stage 2 and the constant bias voltages BP1− and BN1− of the negative-only output stage 3 are different from each other. Here, in order to set the output of the negative-only output stage 3 to a high-impedance state, it is only necessary to close the switches S12 and S14 and open the switches S11 and S13.

One feature of the negative-only output stage 3 is in, that components other than the switches operate with the intermediate voltage VDD/2 as the positive power supply voltage and at the low-voltage side power supply voltage VSS as the negative power supply voltage. Thus, a power amount consumed at the output stage is made about half.

Example 2 in First Embodiment

Figure 7:
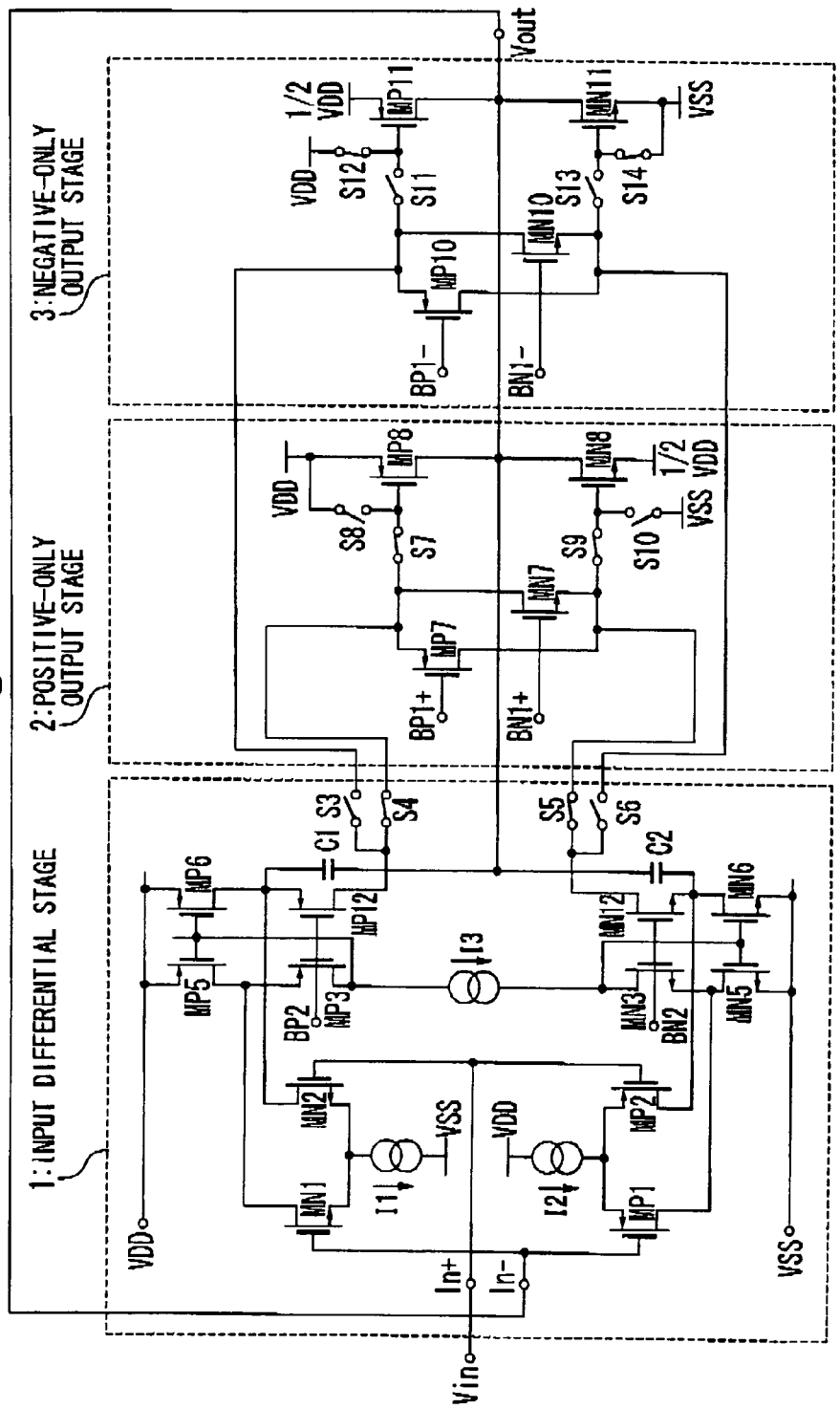
FIG. 7 shows an example 2 of the operational amplifier according to the first embodiment of the present invention.

FIG. 7 shows an example 2 of the operational amplifier according to the first embodiment of the present invention. In the example 2 of the first embodiment, only changes to the example 1 of the first embodiment will be described and overlapping explanations will be omitted.

In the input differential stage 1, the switches S1 and S2 are removed, and the drain of the transistor MP5 and the source of the transistor MP3 are connected to each other, and the drain of the transistor MN5 and the source of the transistor MN3 are connected to each other. In the positive-only output stage 2, the transistor MP4 and the transistor MN4 are removed, the other end of the switch S4 and the source of the transistor MP7 are connected to each other, and the other end of the switch S5 and the source of the transistor MN7 are connected to each other. In the negative-only output stage 3, the transistor MP9 and the transistor MN9 are removed, the other end of the switch S3 and the source of the transistor MP10 are connected to each other, and the other end of the switch S6 and the source of the transistor MN10 are connected to each other.

The input differential stage 1 is further provided with a twelfth P-channel MOS transistor MP12 (hereinafter, to be referred to as a transistor MP12) and a twelfth N-channel MOS transistor MN12 (hereinafter, to be referred to as a transistor MN12). The source of the transistor MP12 is connected to the drain of the transistor MP6, the gate thereof is connected to the constant voltage BP2, and the drain thereof is connected to the one ends of the switches S3 and 54. The source of the transistor M12 is connected to the drain of the transistor MN6, the gate thereof is connected to the constant voltage BN2, and the drain thereof is connected to the one ends of the switches S5 and S6.

The operation of the example 2 of the first embodiment is the same as that of the example 1 of the first embodiment.

Second Embodiment

Figure 10:
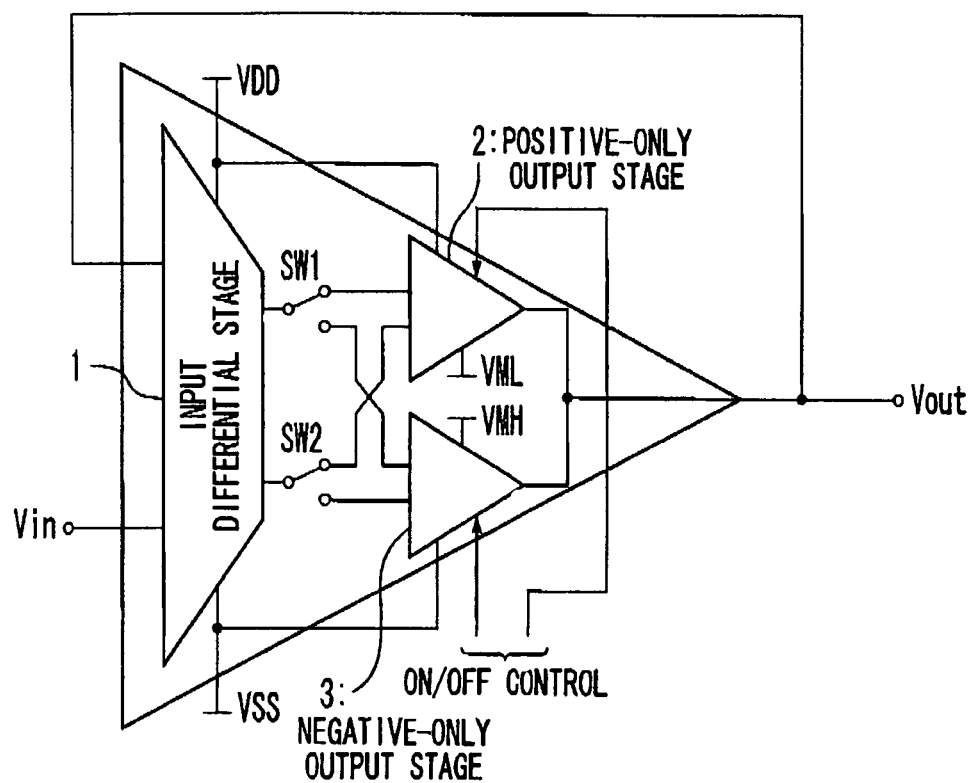
FIG. 10 shows a configuration of the operational amplifier according to the second embodiment of the present invention.
Figure 11:
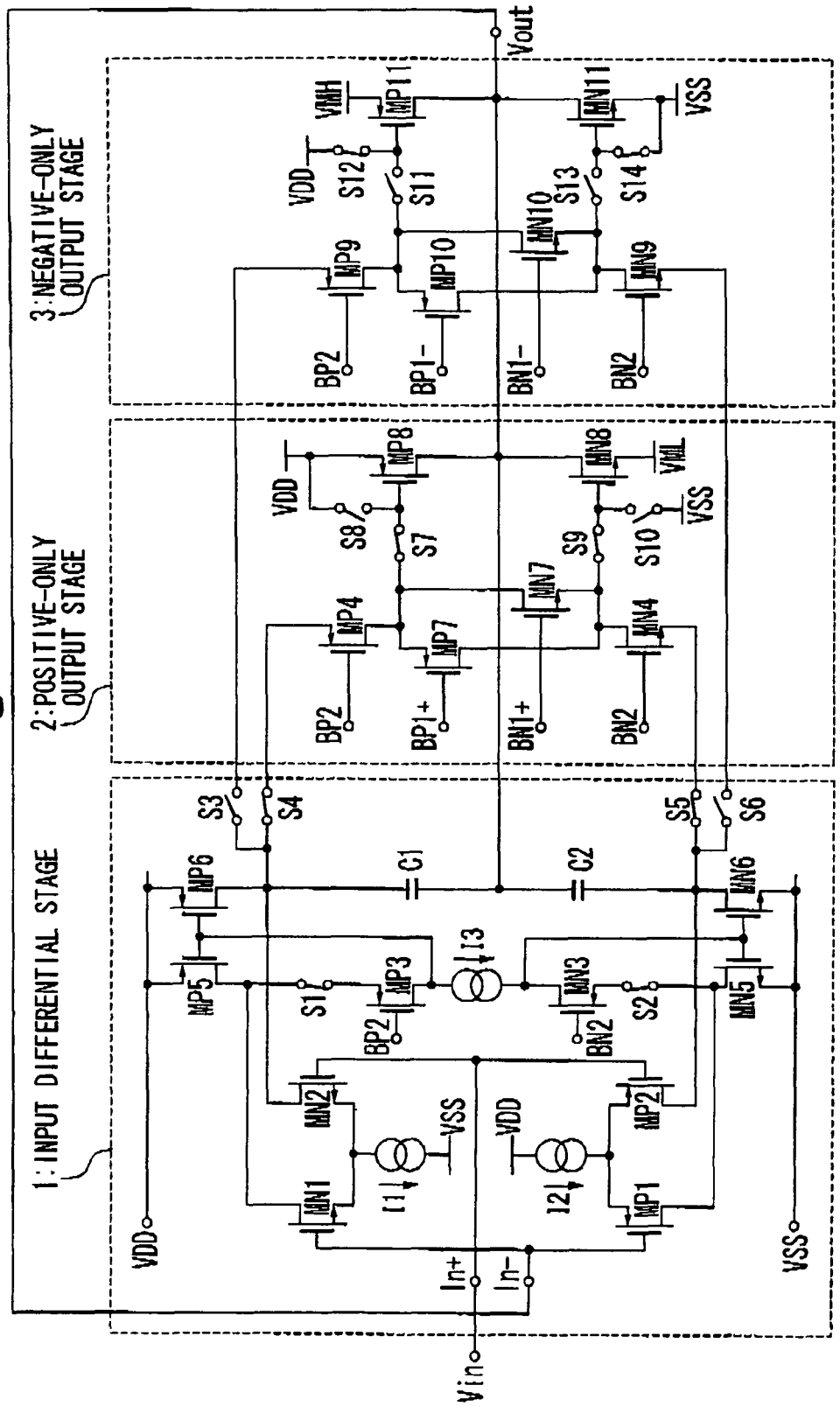
FIG. 11 shows an example 1 of the operational amplifier according to the second embodiment of the present invention.
Figure 12:
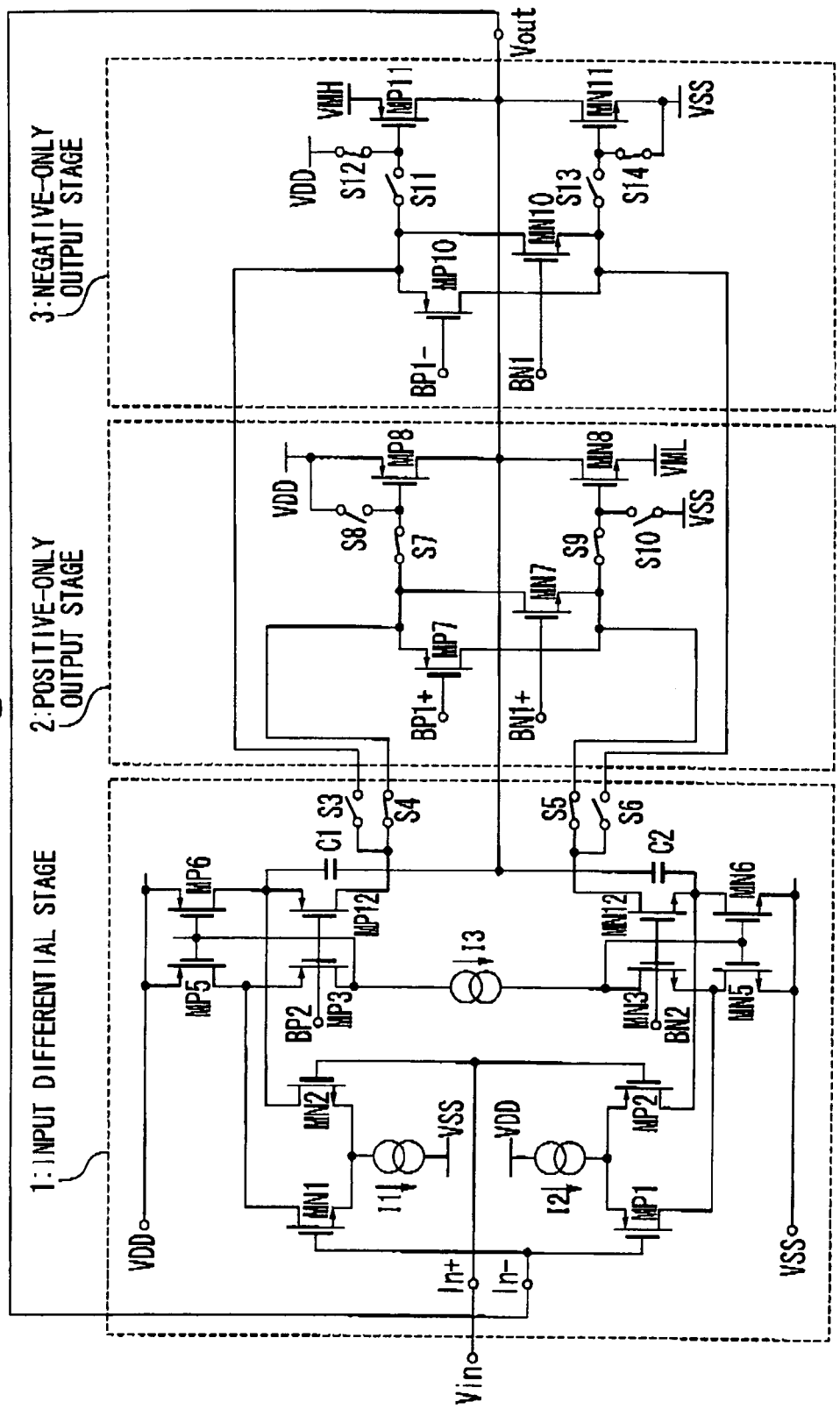
FIG. 12 shows an example 2 of the operational amplifier according to the second embodiment of the present invention.

FIG. 10 shows a configuration of an operational amplifier according to a second embodiment of the present invention. FIG. 11 shows an example 1 of the operational amplifier according to the second embodiment of the present invention. FIG. 12 shows an example 2 of the operational amplifier according to the second embodiment of the present invention. In the second embodiment and the examples 1 and 2 thereof, only changes to the first embodiment and the examples 1 and 2 thereof will be described, and overlapping explanations will be omitted.

In the second embodiment, a first voltage represents a voltage VML (VML=VDD/2−0.2 V) obtained by subtracting a voltage between a source of the transistor MN8 and the low-voltage side power supply voltage VSS (for example, 0.2 V) from the intermediate voltage VDD/2. A second voltage represents a voltage VMH (VMH=VDD/2+0.2 V) obtained by adding a voltage between a source of the transistor MP11 and the second power supply voltage VDD/2 (for example, 0.2 V) to the intermediate voltage VDD/2. In this case, the source of the transistor MN8 of the positive-only output stage 2 is connected with the power supply voltage VML as the first power supply voltage. The source of the transistor MP11 of the negative-only output stage 3 is connected with a power supply voltage VMH as the second power supply.

The operation of the operational amplifier according to the second embodiment and the examples 1 and 2 thereof are the same as those of the first embodiment and the examples 1 and 2 thereof. Therefore, explanations with reference to FIGS. 8 and 9 will be omitted.

In the first embodiment, the output voltage range of the positive-only output stage 2 is set to a range from the intermediate voltage VDD/2 to the high-voltage side power supply voltage VDD, but in actual operation, it is limited to a range from about VDD/2+0.2 V to about VDD−0.2 V due to the operations of the output transistors. Similarly, the output voltage range of the negative-only output stage 3 is set to a range from the low-voltage side power supply voltage VSS (GND) to the intermediate voltage VDD/2, but in actual operation, it is limited from about VSS (GND)−0.2 V to about VDD/2−0.2 V due to the operations of the output transistors. Therefore, the operational amplifier cannot operate with a range from VDD/2−0.2 V to VDD/2+0.2 V around the intermediate voltage. This is not problem in a certain application to a liquid crystal display panel, but the operation in the range may be required in some cases. The second embodiment solves such a matter.

Next, the output voltage range of the positive-only output stage 2 will be described below. In the positive-only output stage 2, since the source of the transistor MN8 is connected to the first power supply voltage VDD/2, the output voltage range on the low-voltage side is VDD/2+0.2 V. Since a source of the transistor MP8 is connected to the high-voltage side power supply voltage VDD, the output voltage range on the high-voltage side is VDD−0.2 V. Therefore, the output voltage range of the positive-only output stage 2 is set to a range from VDD/2+0.2 V to VDD−0.2 V.

Next, the output voltage range of the negative-only output stage 3 will be described below. In the negative-only output stage 3, since the source of the transistor MN11 is connected to the low-voltage side power supply voltage VSS, the output voltage range on the low-voltage side is VSS+0.2 V. Since the source of the transistor MP11 is connected to the second power supply voltage VDD/2, the output voltage range on the high-voltage side is VDD/2−0.2 V. Therefore, the output voltage range of the negative-only output stage 3 is from VSS+0.2 V to VDD/2−0.2 V.

Setting the above output voltage ranges to the positive-only output stage 2 and the negative-only output stage 3 results in rail-to-rail output. That is, by setting VML=VDD/2−0.2 V, the output voltage range of the positive-only output stage 2 becomes a range from VDD/2 to VDD−0.2 V. On the other hand, by setting VMH=VDD/2+0.2 V, the output voltage range of the negative-only output stage 3 becomes a range from VSS+0.2 V to VDD/2.

Due to setting VML=VDD/2−0.2 V and VMH=VDD/2+0.2 V, the operational amplifier according to the second embodiment of the present invention does not become inoperative in around the intermediate voltage. In this manner, making the negative power supply voltage of the positive-only output stage 2 and the positive power supply voltage of the negative-only output stage 3 independent from each other provides the advantage of increasing the degree of freedom in design in addition to the effect of the first embodiment.

Third Embodiment

Figure 13:
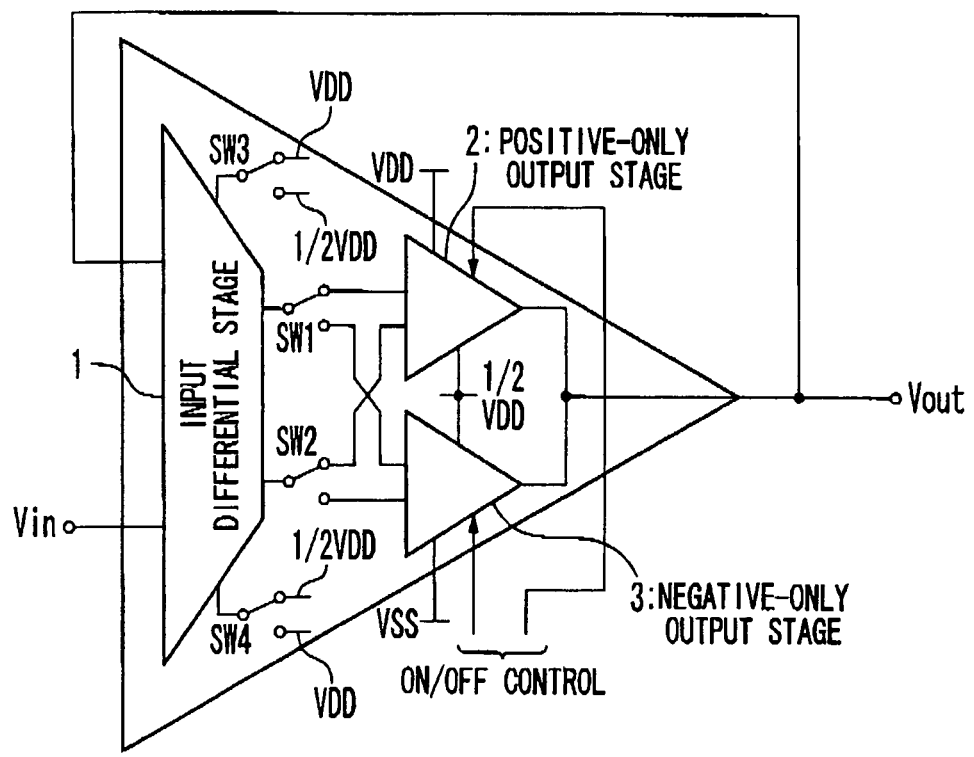
FIG. 13 shows a configuration of the operational amplifier according to the third embodiment of the present invention.

FIG. 13 shows a configuration of an operational amplifier according to a third embodiment of the present invention. In the third embodiment, only changes to the first embodiment and the examples 1 and 2 thereof will be described, and overlapping explanations will be omitted.

The operational amplifier according to the third embodiment of the present invention is further provided with switch sections SW3 and SW4, and a selection control section (not shown). The switch section SW3 is provided on the side of the positive power supply voltage of the input differential stage 1 to select the intermediate voltage VDD/2 or the high-voltage side power supply voltage VDD. The switch section SW4 is provided on the side of the negative power supply of the input differential stage 1 to select the intermediate voltage VDD/2 or the low-voltage side power supply voltage VSS. The selection control section (not shown) is not necessarily provided within the operational amplifier, and it may be provided within the source driver 30.

The input differential stage 1 may be desired to operate with the intermediate voltage VDD/2 like the output stages. As a measure for this case, the selection control section (not shown) controls the switch section SW3 such that the positive power supply voltage of the input differential stage 1 is the high-voltage side power supply voltage VDD, and controls the switch section SW4 such that the negative power supply voltage of the input differential stage 1 is the intermediate voltage VDD/2, when the input voltage is in a range between the intermediate voltage VDD/2 and the high-voltage side power supply voltage VDD. Similarly, the selection control section (not shown) controls the switch section SW3 such that the positive power supply voltage is the intermediate voltage VDD/2, and controls the switch section SW4 such that the negative power supply voltage is the low-voltage side power supply voltage VSS (GND), when the input voltage is in a range between the low-voltage side power supply voltage VSS (GND) and the intermediate voltage VDD/2.

In this way, in the operational amplifier according to the third embodiment of the present invention, the voltage applied to the input differential stage 1 is set to be half. That is, there is the advantage that not only does the power amount consumed in the input differential stage 1 become half, but the breakdown voltages of the transistors used can be halved.

Example 1 in Third Embodiment

Figure 14:
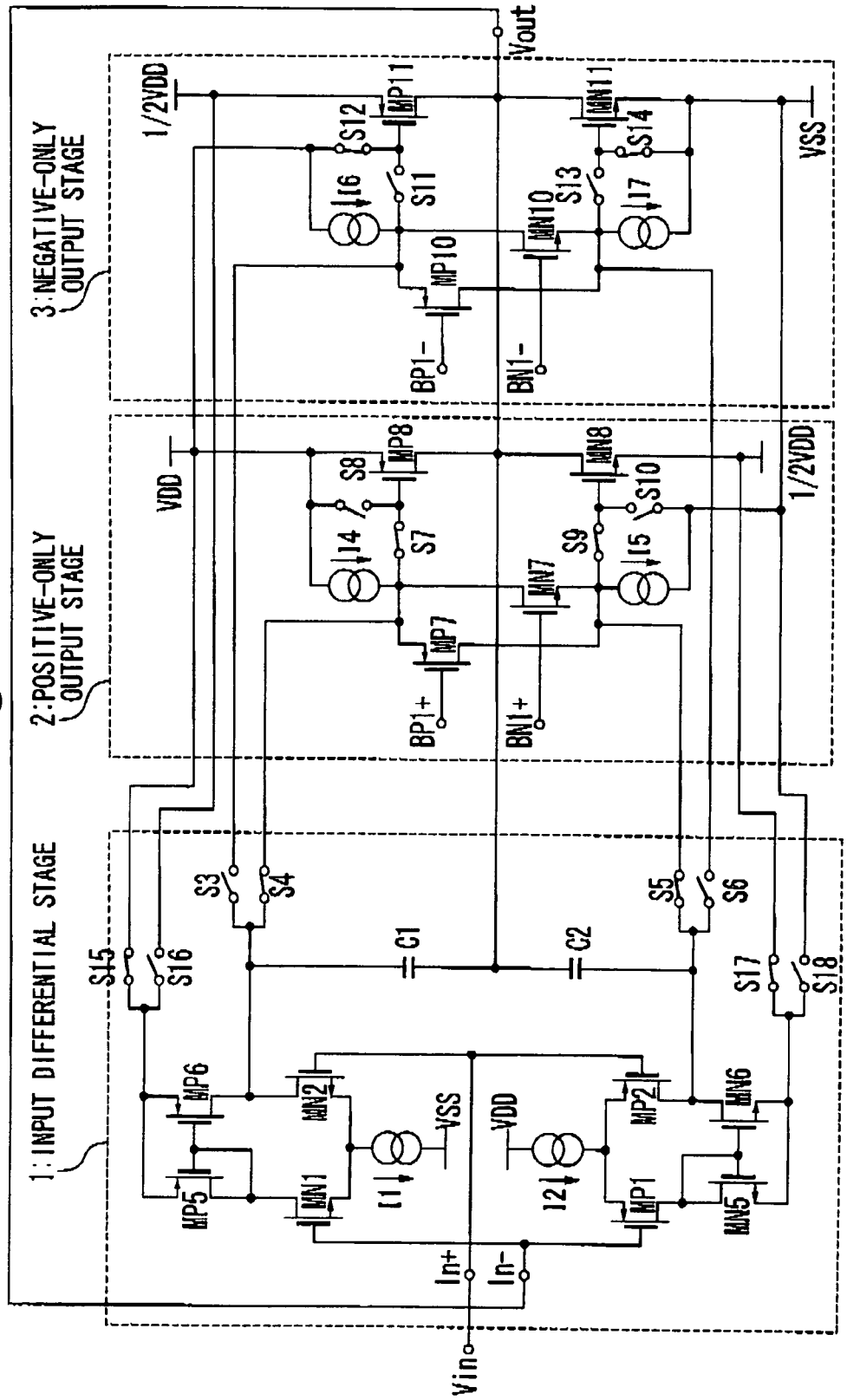
FIG. 14 shows an example 1 of the operational amplifier according to the third embodiment of the present invention.

FIG. 14 shows an example 1 of the operational amplifier according to the third embodiment of the present invention. In the example 1 of the third embodiment, only changes to the first embodiment and the examples 1 and 2 thereof will be described, and overlapping explanations will be omitted.

In the input differential stage 1, the transistors MP3 and MP12, the transistors MN3 and MN12, and the constant current source I3 are removed, the gates of the transistors MP5 and MP6 are connected to the drain of the transistor MP5, and the gates of the transistors MN5 and MN6 are connected to the drain of the transistor MN5. The positive-only output stage 2 is further provided with fourth and fifth constant current sources I4 and I5 (hereinafter, to be referred to as constant current sources I4 and I5). The constant current source I4 is provided between the other end of the switch S8 and one end of the switch S7. The constant current source I5 is connected between one end of the switch S9 and a source of the transistor MN8. The negative-only output stage 3 is further provided with sixth and seventh constant current sources I6 and I7 (hereinafter, to be referred to as constant current sources I6 and I7). The constant current source I6 is provided between the other end of the switch S12 and one end of the switch S11. The constant current source I7 is connected between one end of the switch S13 and the other end of the switch S14.

The switch section SW3 is provided with fifteenth and sixteenth switches S15 and S16 (hereinafter, to be referred to as switches S15 and S16). The switch section SW4 is provided with seventeenth and eighteenth switches S17 and S18 (hereinafter, to be referred to as switches S17 and S18). One end of the switch S15 is connected to the sources of the transistors MP5 and MP6, and the other end thereof is connected to the high-voltage side power supply voltage VDD. One end of the switch S16 is connected to one end of the switch S15, and the other end thereof is connected to the second power supply voltage VDD/2. One end of the switch S17 is connected to the sources of the transistors MN5 and MN6, and the other end thereof is connected to the first power supply voltage VDD/2. One end of the switch S18 is connected to one end of the switch S17, and the other end thereof is connected to the low-voltage side power supply voltage VSS.

FIG. 16 shows timing charts in the operation of the example 1 of the operational amplifier according to the third embodiment of the present invention. In the example 1 of the third embodiment, only changes to the first embodiment and the examples 1 and 2 thereof will be described, and overlapping explanations will be omitted. Therefore, explanation with reference to FIG. 8 will be omitted.

First, signals supplied from the selection control section (not shown) to the switches S15 to S18 will be described.

The selection control section (not shown) supplies selection signals SEL to the switches S15 to S18 in response to the input voltage. The selection control section (not shown) outputs a first selection signal as the selection signal SEL when the input voltage is, in a range between the intermediate voltage VDD/2 and the high-voltage side power supply voltage VDD, and outputs a second selection signal as the selection signal SEL when the input voltage is in a range between the low-voltage side power supply voltage VSS (GND) and the intermediate voltage VDD/2. Here, since the first selection signal is a signal when the selection signal SEL is in the high level, the first selection signal is referred to as a first selection signal SEL "High". Since the second selection signal is a signal when the selection signal SEL is in the low level, the second selection signal is referred to as a second selection signal SEL "Low".

Next, the operations of the switches S15 to S18 will be described.

The selection control section (not shown) outputs the first selection signals SEL "High" when the input voltage is in a range between the intermediate voltage VDD/2 and the high-voltage side power supply voltage VDD. The switches S15 and S17 are turned on in response to the first selection signal SEL "High", and the switches S16 and S18 are turned off in response to the first selection-signal SEL "High". In this case, the positive power supply voltage of the input differential stage 1 is supplied with the high-voltage side power supply voltage VDD, and the negative power supply voltage of the input differential stage 1 is supplied with the intermediate voltage VDD/2.

The selection control section (not shown) outputs the second selection signal SEL "Low" when the input voltage is in a range between the low-voltage side power supply voltage VSS (GND) and the intermediate voltage VDD/2. The switches S15 and S17 are turned off in response to the second selection signal SEL "Low", and the switches S16 and 518 are turned on in response to the second selection signal SEL "Low". In this case, the positive power supply voltage of the input differential stage 1 is supplied with the intermediate voltage VDD/2, and the negative power supply voltage of the input differential stage 1 is supplied with the low-voltage side power supply voltage VSS (GND). In this manner, whether to output the first selection signal SEL "High" or the second selection signal SEL "Low" is determined based on the input voltage.

Example 2 in Third Embodiment

Figure 15:
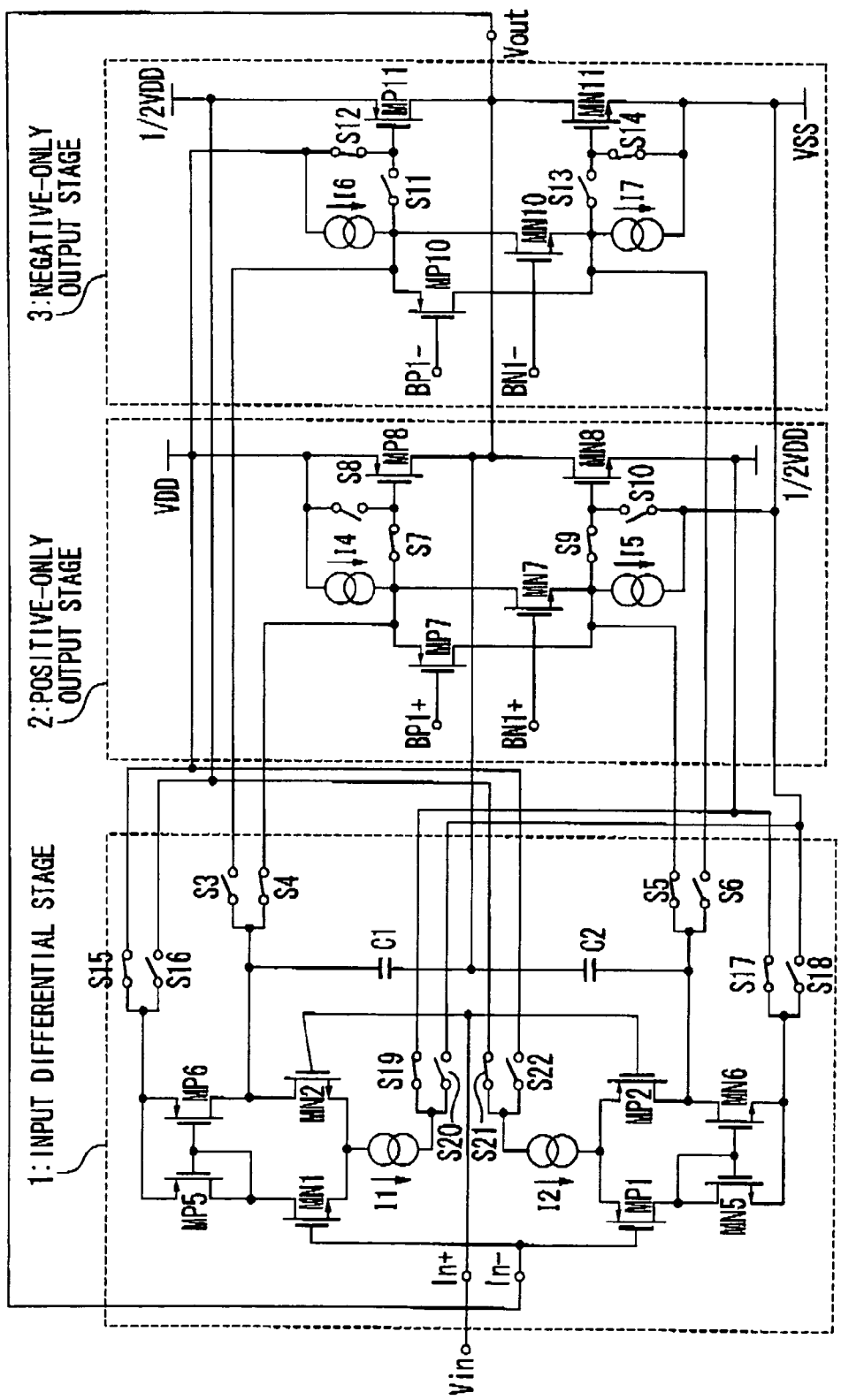
FIG. 15 shows an example 2 of the operational amplifier according to the third embodiment of the present invention.

FIG. 15 shows the example 2 of the operational amplifier according to the third embodiment of the present invention. In the example 2 of the third embodiment, only changes to the examples 1 of the third embodiment will be described, and overlapping explanations will be omitted.

The input differential stage 1 is further provided with nineteenth to twenty-second switches S19, S20, S21 and S22 (hereinafter, to be referred to as switches S19, S20, S21 and S22). One end of the switch S19 is connected to the constant current source I1, and the other end thereof is connected to the first power supply voltage VDD/2. One end of the switch S20 is connected to one end of the switch S19, and the other end thereof is connected to the low-voltage side power supply voltage VSS. One end of the switch S21 is connected to the constant current source I2, and the other end thereof is connected to the high-voltage side power supply voltage VDD. One end of the switch S22 is connected to one end of the switch S21, and the other end thereof is connected to the second power supply voltage VDD/2.

FIG. 17 is a timing chart showing the operation of the example 2 of the operational amplifier according to the third embodiment of the present invention. In the example 2 of the third embodiment, only changes to the Example 1 of the third embodiment will be described, and overlapping explanations will be omitted. Therefore, explanation with reference to FIGS. 8 and 16 will be omitted.

The operations of the switches S19 to S22 will be described. The selection control section (not shown) outputs the first selection signal SEL "High" when the input voltage is in a range between the intermediate voltage VDD/2 and the high-voltage side power supply voltage VDD. The switches S19 and S21 are turned on in response to the first selection signal SEL "High", and the switches S20 and S22 are turned off in response to the first selection signal SEL "High". The selection control section (not shown) outputs the second selection signal SEL "Low" when the input voltage is in a range between the low-voltage side power supply voltage VSS (GND) and the intermediate voltage VDD/2. The switches S19 and S21 are turned off in response to the second selection signal. SEL "Low", and the switches S20 and S22 are turned on in response to the second selection signal SEL "Low".

This has the effect that the voltage applied to the input differential stage 1 is made constant, and therefore an offset voltage before and after switching is made constant. In addition, it is possible to halve the voltage applied to the transistors, so that it is possible to use transistors with lower breakdown voltage.

Fourth Embodiment

Figure 18:
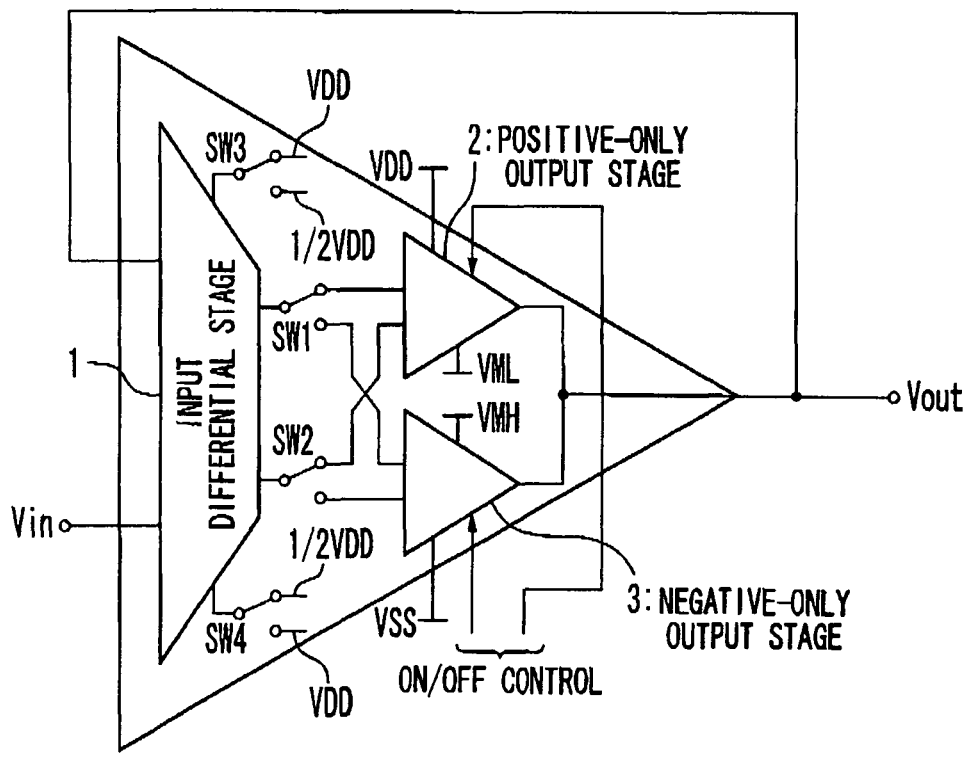
FIG. 18 shows a configuration of the operational amplifier according to the fourth embodiment of the present invention.
Figure 19:
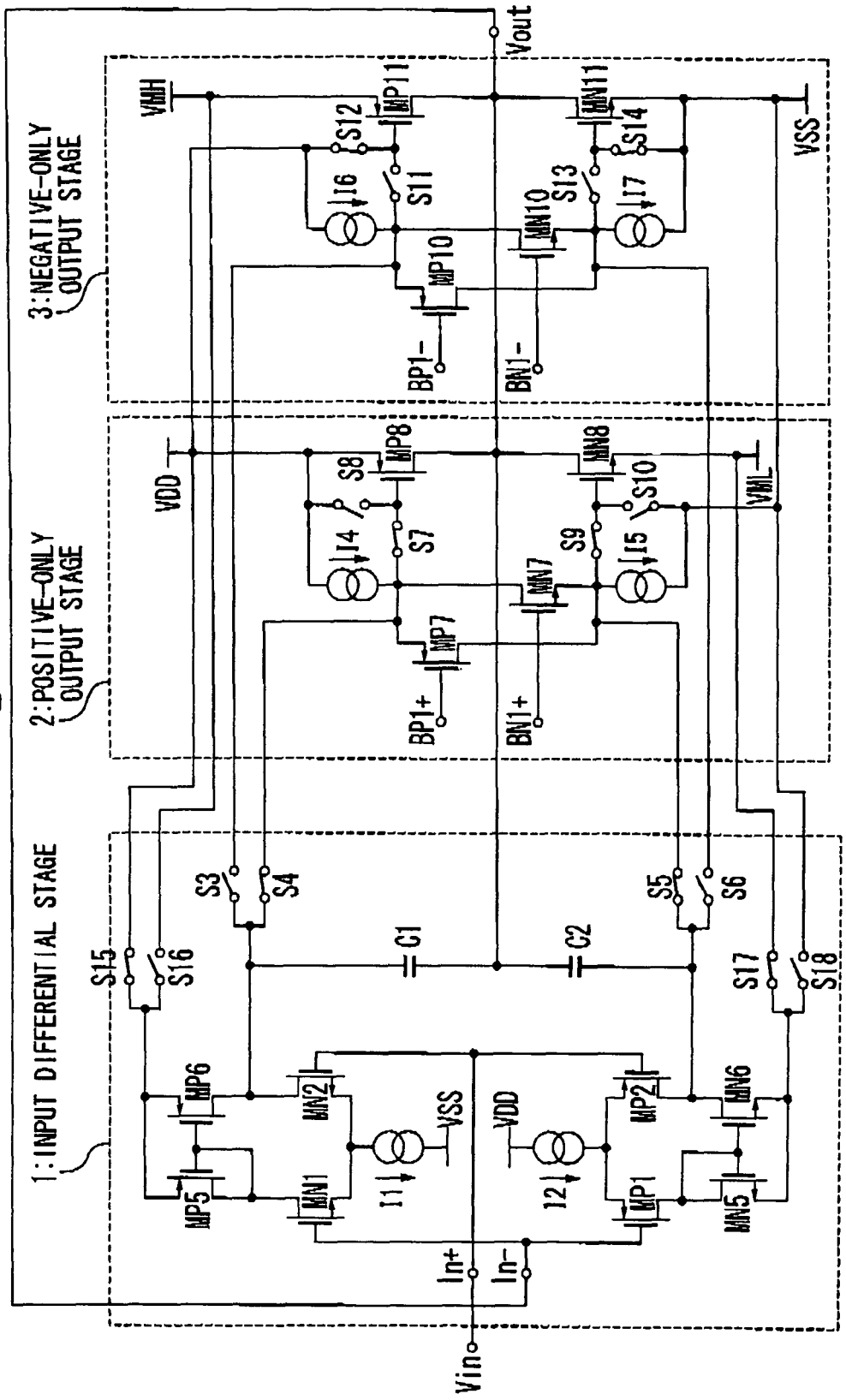
FIG. 19 shows an example 1 of the operational amplifier in FIG. 18.
Figure 20:
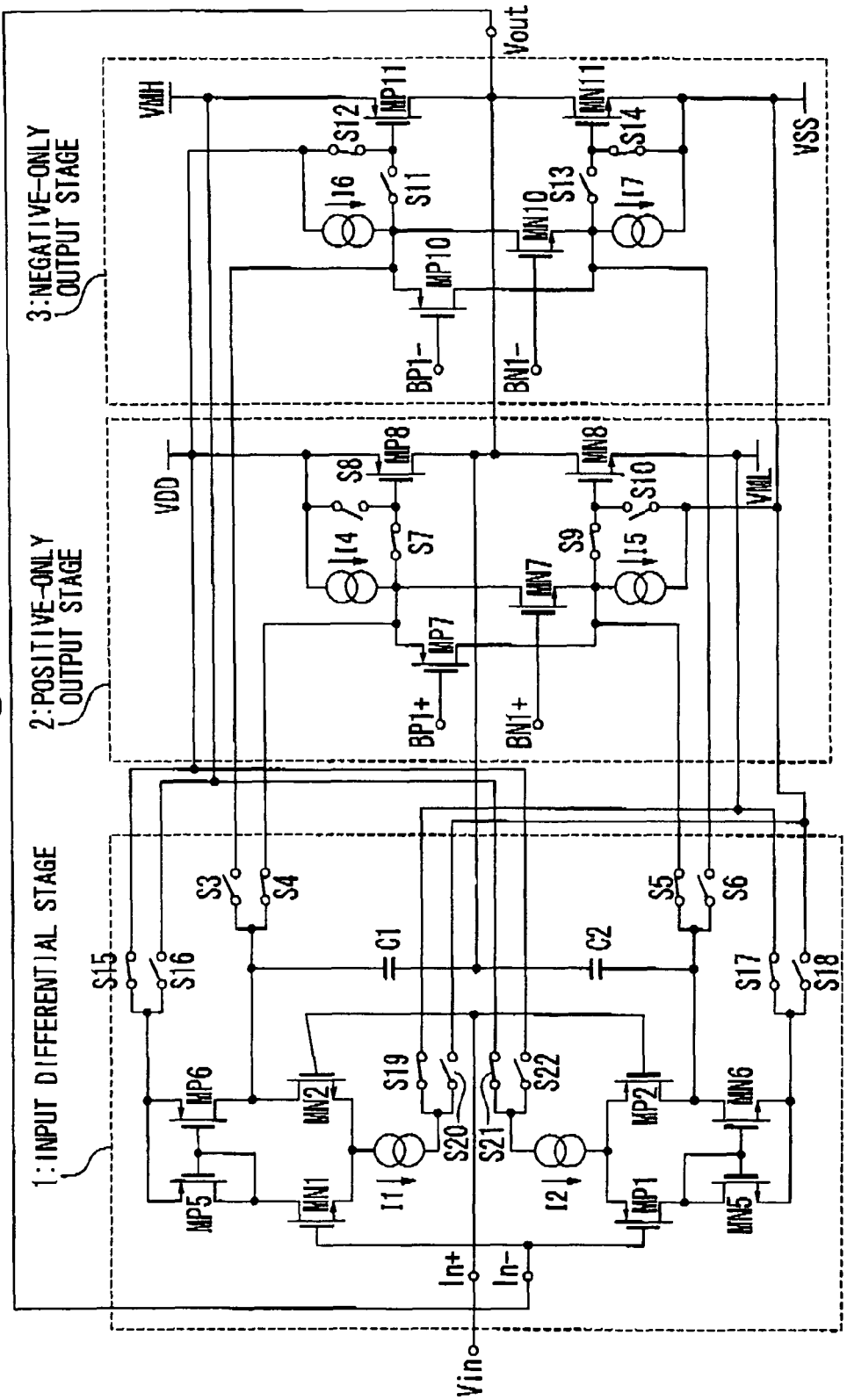
FIG. 20 shows an example 2 of the operational amplifier in FIG. 18.

FIG. 18 shows a configuration of the operational amplifier according to a fourth embodiment of the present invention. FIG. 19 shows an example 1 of the operational amplifier according to the fourth embodiment of the present invention. FIG. 20 shows an example 2 of the operational amplifier according to the fourth embodiment of the present invention. In the fourth embodiment and the examples 1 and 2 thereof, only changes to the third embodiment and the examples 1 and 2 thereof will be described, and overlapping explanations will be omitted.

In the fourth embodiment, the first voltage represents the voltage VML (VML=VDD/2−0.2 V) obtained by subtracting a voltage between a source of the transistor MN8 and the low-voltage side power supply voltage VSS (for example, 0.2 V) from the intermediate voltage VDD/2. The second voltage represents a voltage VMH (VMH=VDD/2+0.2 V) obtained by adding a voltage between a source of the transistor MP11 and the second power supply voltage VDD/2 (for example, 0.2 V) to the intermediate voltage VDD/2. In this case, the source of the transistor MN8 of the positive-only output stage 2 is connected with a power supply voltage VML as the first power supply voltage. The source of the transistor MP11 of the negative-only output stage 3 is connected with a power supply voltage VMH as the second power supply.

The operation of the operational amplifier according to the fourth embodiment of the present invention and the examples 1 and 2 thereof are the same as those of the third embodiment and the examples 1 and 2 thereof. Therefore, explanations with reference to FIGS. 8, 16 and 17 will be omitted.

The effect of the operational amplifier according to the fourth embodiment of the present invention is the same as that of the second embodiment. That is, by setting VML=VDD/2−0.2 V and VMH=VDD/2+0.2 V, the operational amplifier according to the fourth embodiment of the present invention does not become inoperative in around the intermediate voltage. In this manner, the negative power supply voltage of the positive-only output stage 2 and the positive power supply voltage of the negative-only output stage 3 can be made independent from each other, resulting in the advantage of increasing the degree of freedom in design in addition to the effects of the first and third embodiments.

It should be noted that the switches S1 to S22 are supplied with the above-described signals. Specifically, the switches S1 to S18 are supplies with the above-described polarity signals, and the switches S19 to S22 are supplied with the above-described selection signals. The switches S1 to S22 can be realized by, for example, a first, a second or a third configuration. As the first configuration, the above switches S1 to S22 may be N-channel MOS transistors, the gates of which are supplied with the above signals. As the second configuration, when the signals levels of the above signals are inverted, the above switches S1 to S22 may be P-channel MOS transistors, the gates of which are supplied with the above signals. As the third configuration, such a circuit may be adopted that the above switches S1 to S22 may be circuits where the sources and drains of the N-channel MOS transistors and the sources and drains of the P-channel MOS transistors are connected to each other, inverters are provided between the gates of the N-channel MOS transistors and the gates of the P-channel MOS transistors, and ones of the gates of the N-channel MOS transistors or the gates of the P-channel MOS transistors are supplied with the above signals. Though the first to third configurations are well-known, the switches S1 to S22 can be realized by another well-known configuration.

Figure 21:
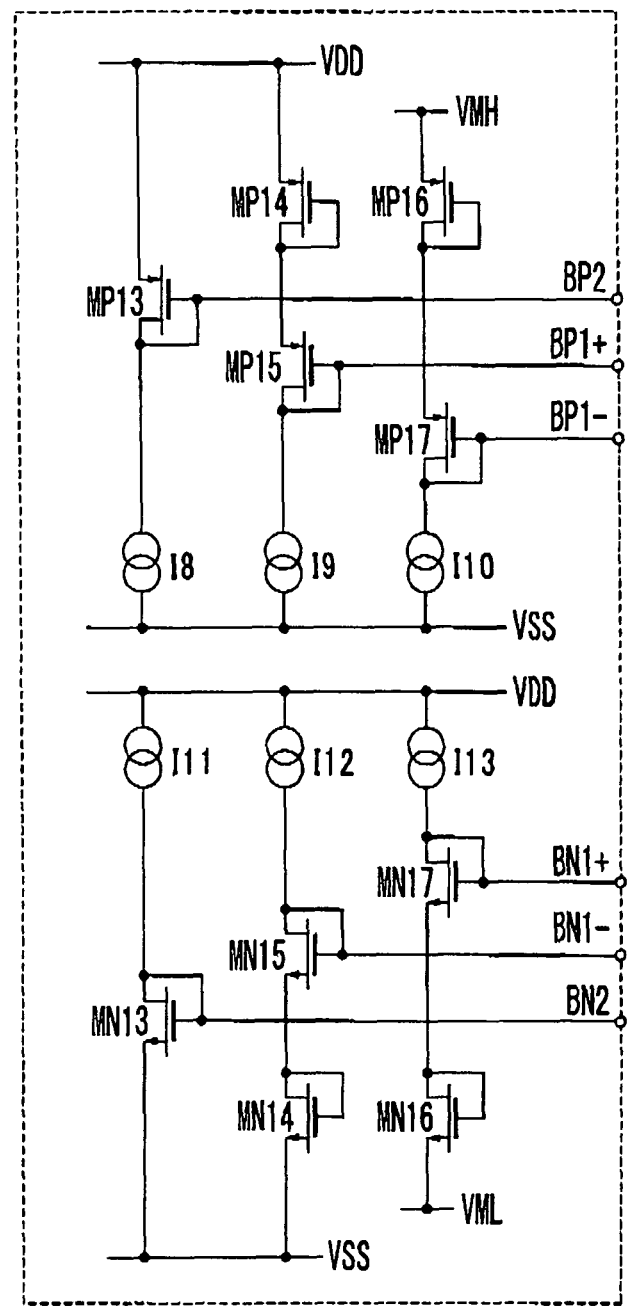
FIG. 21 shows a bias circuit for realizing bias voltages BP2, BN2, BP1+, BN1+, BP1−, and BN1−.

The constant bias voltages BP2, BN2, BP1+, BN1+, BP1− and BN1− are realized by such a bias circuit as shown in FIG. 21. Here, one feature of the bias circuit is in that the constant bias voltage BP1− is generated from the second voltage VHM, and the constant bias voltage BN1+ is generated from the first voltage VML. This will specifically be described.

The bias circuit is provided with the above-described first to sixth constant voltage sources [BP2], [BN2], [BP1+], [BN1+], [BP1−] and [BN1−]. The constant voltage BP2 is provided with a thirteenth P-channel MOS transistor MP13 (hereinafter, to be referred to as a transistor MP13) and an eighth constant current source I8 (hereinafter, to be referred to as a constant current source I8). The constant current source I8 is provided between a drain of the transistor MP13 and a low-voltage side power supply voltage VSS. A source of the transistor MP13 is connected to the high-voltage side power supply voltage VDD, and a gate and a drain thereof are connected to each other, and the gate supplies the constant bias voltage BP2 which is the above first bias voltage. When the constant bias voltage BP2 is denoted as "V(BP2)", the voltage V(BP2) is expressed as a voltage obtained by subtracting a voltage VGS(MP13) between the gate and a source of the transistor MP13 from the high-voltage side power supply voltage VDD (V(BP2)=VDD−VGS(MP13)). The voltage VGS between the gate and the source of the MOS transistor is expressed by the above equation 1.

The constant voltage source [BP1+] is provided with fourteenth and fifteenth P-channel MOS transistors MP14 and MP15 (hereinafter, to be referred to as transistors MP14 and MP15) and a ninth constant current source I9 (hereinafter, to be referred to as a constant current source I9). The constant current source I9 is provided between the drain of the transistor MP15 and the low-voltage side power supply voltage VSS. A source of the transistor MP14 is connected to the high-voltage side power supply voltage VDD, and a gate and a drain thereof are connected to each other. A source of the transistor MP15 is connected to the drain of the transistor MP14, a gate and a drain thereof are connected to each other, and the gate supplies the constant bias voltage BP1+ which is the above third bias voltage. When the constant bias voltage BP1+ is denoted by "V(BP1+)", the voltage V(BP1+) is expressed as a voltage obtained by subtracting a voltage VGS (MP14) between the gate and the source of the transistor MP14 and a voltage VGS(MP15) between the gate and the source of the transistor MP15 from the high-voltage side power supply voltage VDD(V(BP1+)=VDD−VGS(MP14)−VGS(MP15)). The voltages VGS between the gate and the source of the MOS transistors are expressed by the above equation 1.

The constant voltage source [BP1−] is provided with sixteenth and seventeenth P-channel MOS transistors MP16 and MP17 (hereinafter, to be referred to as transistors MP16 and MP17) and a tenth constant current source I10 (hereinafter, to be referred to as a constant current source I10). The constant current source I10 is provided between the drain of the transistor MP17 and the low-voltage side power supply voltage VSS. A source of the transistor MP16 is connected to a second power supply voltage VMH as the second voltage, and a gate and a drain thereof are connected to each other. A source of the transistor MP17 is connected to the drain of the transistor MP16, a gate and a drain thereof are connected to each other, and the gate supplies the constant bias voltage BP1− which is the above fifth bias voltage. When the constant bias voltage BP1− is denoted by "V(BP1−)", the voltage V(BP1−) is expressed as a voltage (V(BP1−)=VMH−VGS(MP16)−VGS(MP17)) obtained by subtracting a voltage VGS(MP16) between the gate and the source of the transistor MP16 and a voltage VGS(MP17) between the gate and the source of the transistor MP17 from the second voltage VMH. A voltage VGS between the gate and the source of the MOS transistor is expressed by the above equation 1.

The constant voltage source [BN2] is provided with a thirteenth N-channel MOS transistor MN13 (hereinafter, to be referred to as a transistor MN13) and an eleventh constant current source I11 (hereinafter, to be referred to as a constant current source I11). The constant current source I11 is provided between the high-voltage side power supply voltage VDD and the drain of the transistor MN13. A source of the transistor MN13 is connected to the low-voltage side power supply voltage VSS, and a gate and a drain thereof are connected to each other, and the gate supplies the constant bias voltage BN2 which is the above second bias voltage. When the constant bias voltage BN2 is denoted by "V(BN2)" the voltage V(BN2) is expressed as a voltage (V(BN2)=VSS+VGS(MN13)) expressing a summation of the low-voltage side power supply voltage VSS and a voltage VGS(MN13) between the gate and the source of the transistor MN13. A voltage VGS between the gate and the source of the MOS transistor is expressed by the above equation 1.

The constant voltage source [BN1−] is provided with fourteenth and fifteenth N-channel MOS transistors MN14 and MN15 (hereinafter, to be referred to as transistors MN14 and MN15) and a twelfth constant current source I12 (hereinafter, to be referred to as a constant current source I12). The constant current source I12 is provided between the high-voltage side power supply voltage VDD and the drain of the transistor MN15. A source of the transistor MN14 is connected to the low-voltage side power supply voltage VSS, and a gate and a drain thereof are connected to each other. A source of the transistor MN15 is connected to the drain of the transistor MN14, a gate and a drain thereof are connected to each other, and the gate supplies the constant bias voltage BN1− which is the above sixth bias voltage. When the constant bias voltage BN1− is denoted by V(BN1−), the voltage V(BN1−) is expressed as a voltage (V(BN1−)=VSS+VGS(MN14)+VGS(MN15)) expressing a summation of the low-voltage side power supply voltage VSS, a voltage VGS(MN14) between the gate and the source of the transistor MN14 and a voltage VGS(MN15) between the gate and the source of the transistor MN15. A voltages VGS between the gate and the source of the MOS transistor is expressed by the above equation 1.

The constant voltage source [BN1+] is provided with sixteenth and seventeenth N-channel MOS transistors MN16 and MN17 (hereinafter, to be referred to as transistors MN16 and MN17) and a thirteenth constant current source I13 (hereinafter, to be referred to as a constant current source I13). The constant current source I13 is provided between the high-voltage side power supply voltage VDD and the drain of the transistor MN17. The source of the transistor MN16 is connected to a first power supply voltage VML as a first voltage VML, and the gate and the drain thereof are connected to each other. The source of the transistor MN17 is connected to the drain of the transistor MN16, the gate and the drain thereof are connected to each other, and the gate supplies the constant bias voltage BN1+ which is the above fourth bias voltage. When the constant bias voltage BN1+ is denoted by V(BN1+), the voltage V(BN1+) is expressed as a voltage (V(BN1+)=VSS+VGS(MN16)+VGS(MN17)) expressing the sum of the low-voltage side power supply voltage VSS, a voltage VGS (MN16) between the gate and the source of the transistor MN16 and a voltage VGS (MN17) between the gate and the source of the transistor MN17. A voltages VGS between the gate and the source of the MOS transistor is expressed by the above equation 1.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. An operational amplifier comprising:
   an input differential stage comprising one external input receiving an external input voltage and two outputs;
   two output stages; and
   a switch section provided between inputs of said two output stages and the two outputs of said input differential stage, and configured to alternately connect the two outputs of said input differential stage and inputs of a positive-only output stage of said two output stages; and the two outputs of said input differential stage and inputs of a negative-only output stage of said two output stages.

2. The operational amplifier according to claim 1, wherein a first polarity signal and a second polarity signal are alternately supplied to said switch section, and
   wherein said switch section connects the two outputs of said input differential stage and the inputs of said positive-only output stage in response to the first polarity signal, and connects the two outputs of said input differential stage and the inputs of said negative-only output stage in response to the second polarity signal.

3. The operational amplifier according to claim 2, wherein said positive-only output stage operates between a high-voltage side power supply voltage and one of a first power supply voltage and a lower-voltage side power supply which is lower than the high-voltage side power supply voltage and amplifies and outputs a current corresponding to the first output of said input differential stage to said output node, wherein said negative-only output stage has an output connected in common to an output of said positive-only output stage, operates between the low-voltage side power supply voltage and one of the high-voltage side power supply voltage and a second power supply voltage, and amplifies and outputs a current corresponding to the second output of said input differential stage to said output node, wherein an output on said output node is supplied as an internal input voltage to an internal input of said input differential stage, and wherein the first and second power supply voltages are intermediate voltages between the high-voltage side power supply voltage and the low-voltage side power supply voltage.

4. The operational amplifier according to claim 3, wherein the first power supply voltage is a voltage lower than the intermediate voltage by a voltage between a voltage of the source of said eighth N-channel MOS transistor and the low-voltage side power supply voltage, and said second power supply voltage is a voltage obtained by adding a voltage between the source of said eleventh P-channel MOS transistor and said second power supply voltage to the intermediate voltage.

5. The operational amplifier according to claim 3, wherein the first polarity signal and the second polarity signal are alternately supplied to said positive-only output stage and said negative-only output stage, wherein a third polarity signal is supplied to said positive-only output stage during a period in which a predetermined period after a switching timing from the second polarity signal to the first polarity signal is excluded from a period during which the first polarity signal is supplied, and wherein a fourth polarity signal is supplied to said negative-only output stage during a period in which a predetermined period after a switching timing from the first polarity signal to the second polarity signal is excluded from a period during which the second polarity signal is supplied.

6. The operational amplifier according to claim 5, wherein said positive-only output stage comprises;

a first P-channel MOS transistor having a source connected with one of the inputs of said positive-only output stage, a gate connected with a first bias voltage, and a drain;

a first N-channel MOS transistor having a source connected with the other of the inputs of said positive-only output stage, a gate connected with a second bias voltage and a drain;

a second P-channel MOS transistor having a source connected with the drain of said first P-channel MOS transistor, a drain connected with the drain of said first N-channel MOS transistor and a gate supplied with a third bias voltage;

a second N-channel MOS transistor having a source connected with the drain of said first N-channel MOS transistor, a drain connected with the drain of said first P-channel MOS transistor and a gate supplied with a fourth bias voltage;

a third P-channel MOS transistor having a source connected with the high-voltage side power supply voltage, a drain connected with said output node and a gate;

a third N-channel MOS transistor having a gate, a source connected with the first power supply voltage and a drain connected with said output node;

a first switch provided between the source of said second P-channel MOS transistor and the gate of said third P-channel MOS transistor and configured to turn on in response to the third polarity signal;

a second switch provided between the high-voltage side power supply voltage and the gate of said third P-channel MOS transistor and configured to turn on in response to an inversion signal of the third polarity signal;

a third switch provided between the source of said second N-channel MOS transistor and the gate of said third N-channel MOS transistor and configured to turn on in response to the third polarity signal; and a fourth switch provided between the gate of said third N-channel MOS transistor and one of the low-voltage side power supply voltage and the first power supply voltage and configured to turn on in response to the inversion signal of the third polarity signal, and wherein said negative-only output stage comprises:

a fourth P-channel MOS transistor having a source connected with the one input of said negative-only output stage, a gate connected with said first bias voltage and a drain;

a fourth N-channel MOS transistor having a source connected with the other input of said negative-only output stage, a gate connected with said second bias voltage and a drain;

a fifth P-channel MOS transistor having a source connected with the drain of said fourth P-channel MOS transistor, a drain connected with the drain of said fourth N-channel MOS transistor and a gate supplied with a fifth bias voltage;

a fifth N-channel MOS transistor having a source connected with the drain of said fourth N-channel MOS transistor, a drain connected with the drain of said fourth P-channel MOS transistor and a gate supplied with a sixth bias voltage;

a sixth P-channel MOS transistor having a gate, a source connected with the second power supply voltage and a drain connected with said output node;

a sixth N-channel MOS transistor having a gate, a source connected with the low-voltage side power supply voltage and a drain connected with said output node;

a fifth switch provided between the source of said fifth P-channel MOS transistor and the gate of said sixth P-channel MOS transistor and configured to turn on in response to the fourth polarity signal;

a sixth switch provided between the gate of said sixth P-channel MOS transistor and one of the high-voltage side power supply voltage and the second power supply voltage, and configured to turn on in response to an inversion signal of the fourth polarity signal;

a seventh switch provided between the source of said fifth N-channel MOS transistor and the gate of said sixth N-channel MOS transistor and configured to turn on in response to the fourth polarity signal; and an eighth switch provided between the low-voltage side power supply voltage and the gate of said sixth N-channel MOS transistor and configured to turn on in response to the inversion signal of the fourth polarity signal.

7. The operational amplifier according to claim 5, wherein said positive-only output stage comprises:

a second P-channel MOS transistor having a source connected with one of the inputs of said positive-only output stage, a drain connected with the other of the inputs of said positive-only output stage, and a gate supplied with a third bias voltage;

a second N-channel MOS transistor having a source connected with the one input of said positive-only output stage, a drain connected with the other input of said positive-only output stage, and a gate supplied with a fourth bias voltage;

a third P-channel MOS transistor having a source connected with the high-voltage side power supply voltage, a drain connected with said output node and a gate;

a third N-channel MOS transistor having a gate, a source connected with the first power supply voltage and a drain connected with said output node, a first switch provided between the source of said second P-channel MOS transistor and the gate of said third P-channel MOS transistor and configured to turn on in response to the third polarity signal;

a second switch provided between the high-voltage side power supply voltage and the gate of said third P-channel MOS transistor and configured to turn on in response to an inversion signal of the third polarity signal;

a third switch provided between the source of said second N-channel MOS transistor and the gate of said third N-channel MOS transistor and configured to turn on in response to the third polarity signal; and a fourth switch provided between the gate of said eighth N-channel MOS transistor and one of the low-voltage side power supply voltage and the first power supply voltage and configured to turn on in response to the inversion signal of the third polarity signal, and wherein said negative-only output stage comprises:

a fifth P-channel MOS transistor having a source connected with the one input of said negative-only output stage, a drain connected with the other input of said negative-only output stage, and a gate supplied with a fifth bias voltage;

a fifth N-channel MOS transistor having a drain connected with the one input of said negative-only output stage, a source connected with the other input of said negative-only output stage, and a gate supplied with a sixth bias voltage;

a sixth P-channel MOS transistor having a gate, a source connected with the second power supply voltage and a drain connected with said output node;

a sixth N-channel MOS transistor having a gate, a source connected with the low-voltage side power supply voltage and a drain connected with said output node;

a fifth switch provided between the source of said fifth P-channel MOS transistor and the gate of said sixth P-channel MOS transistor and configured to turn on in response to the fourth polarity signal;

a sixth switch provided between the gate of said sixth P-channel MOS transistor and one of the high-voltage side power supply voltage and the second power supply voltage, and configured to turn on in response to an inversion signal of the fourth polarity signal;

a seventh switch provided between the source of said fifth N-channel MOS transistor and the gate of said sixth N-channel MOS transistor and configured to turn on in response to the fourth polarity signal; and an eighth switch provided between the low-voltage side power supply voltage and the gate of said sixth N-channel MOS transistor and configured to turn on in response to the inversion signal of the fourth polarity signal.

8. The operational amplifier according to claim 7, wherein said positive-only output stage further comprises;

a first constant current source provided in parallel to a series connection of said first switch and said second switch; and a second constant current source provided in parallel to a series connection of said third switch and said fourth switch, and wherein said negative-only output stage further comprises:

a third constant current source provided in parallel to a series connection of said fifth switch and said sixth switch; and a fourth constant current source provided in parallel to a series connection of said seventh switch and said eighth switch.

9. The operational amplifier according to claim 4, wherein said input differential stage operates between the high-voltage side power supply voltage and the low-voltage side power supply voltage, and outputs a difference between an input voltage supplied externally and a voltage supplied to an output node.

10. The operational amplifier according to claim 6, wherein said input differential stage comprises:

seventh and eighth N-channel MOS transistors having sources connected in common to each other, gates and drains;

a fifth constant current source provided between the sources of said seventh and eighth N-channel MOS transistors and the low-voltage side power supply voltage;

seventh and eighth P-channel MOS transistors having gates respectively connected with the gates of said first and second N-channel MOS transistors, sources connected in common to each other, and drains;

a sixth constant current source provided between the high-voltage side power supply voltage and the sources of said seventh and eighth P-channel MOS transistors;

ninth and tenth P-channel MOS transistors having sources connected in common to the high-voltage side power supply voltage, gates connected in common to each other, and drains respectively connected with the drains of said seventh and eighth N-channel MOS transistors, wherein the drain of said tenth P-channel MOS transistor is connected to one of the two outputs of said input differential stage;

ninth and tenth N-channel MOS transistors having sources connected in common to the low-voltage side power supply voltage, gates connected to each other, and drains respectively connected with the drains of said seventh and eighth P-channel MOS transistors, wherein the drain of said tenth N-channel MOS transistor is connected to the other of the two outputs of said input differential stage;

an eleventh P-channel MOS transistor having a source connected with the drain of said ninth P-channel MOS transistor, a gate supplied with the first bias voltage and a drain connected with the gates of said ninth and tenth P-channel MOS transistors;

an eleventh N-channel MOS transistor having a source connected with the drain of said ninth N-channel MOS transistor, a gate supplied with the second bias voltage, and a drain connected with the gates of said ninth and tenth N-channel MOS transistors;

a seventh constant current source provided between the drain of said eleventh P-channel MOS transistor and the drain of said eleventh N-channel MOS transistor;

a first capacitance connected between the drain of said tenth P-channel MOS transistor and said output node; and a second capacitance which was connected between the drain of said tenth N-channel MOS transistor and said output node, wherein said switch section comprises:
a ninth switch provided between the one output of said input differential stage and the one input of said positive-only output stage, and configured to turn on in response to the first polarity signal;
a tenth switch provided between the one output of said input differential stage and the one input of said negative-only output stage and configured to turn on in response to said second polarity signal;
an eleventh switch provided between the other output of said input differential stage and the other input of said positive-only output stage, and configured to turn on in response to said first polarity signal; and
a twelfth switch provided between the other output of said input differential stage and the other input of said negative-only output stage, and configured to turn on in response to said second polarity signal,
wherein the external input voltage is supplied to the gate of said eighth N-channel MOS transistor and the gate of said eighth P-channel MOS transistor, and the gate of said seventh N-channel MOS transistor and the gate of said seventh P-channel MOS transistor are connected with said output node.

11. The operational amplifier according to claim 10, wherein said input differential stage further comprises:
a fifth switch provided between the drain of said tenth P-channel MOS transistor and the source of said eleventh P-channel MOS transistor and being always in an on state; and
a sixth switch provided between the drain of said tenth N-channel MOS transistor and the source of said eleventh N-channel MOS transistor and being always in an on state.

12. The operational amplifier according to claim 7, wherein said input differential stage comprises;
seventh and eighth N-channel MOS transistors having sources connected in common to each other, gates and drains;
a fifth constant current source provided between the sources of said seventh and eighth N-channel MOS transistors and the low-voltage side power supply voltage;
seventh and eighth P-channel MOS transistors having gates respectively connected with the gates of said first and second N-channel MOS transistors, sources connected in common to each other, and drains;
a sixth constant current source provided between the high-voltage side power supply voltage and the sources of said seventh and eighth P-channel MOS transistors;
ninth and tenth P-channel MOS transistors having sources connected in common to the high-voltage side power supply voltage, gates connected in common to each other, and drains respectively connected with the drains of said seventh and eighth N-channel MOS transistors, wherein the drain of said tenth P-channel MOS transistor is connected to one of the two outputs of said input differential stage;
ninth and tenth N-channel MOS transistors having sources connected in common to the low-voltage side power supply voltage, gates connected to each other, and drains respectively connected with the drains of said seventh and eighth P-channel MOS transistors;
an eleventh P-channel MOS transistor having a source connected with the drain of said ninth P-channel MOS transistor, a gate supplied with the first bias voltage and a drain connected with the gates of said ninth and tenth P-channel MOS transistors;
a twelfth P-channel MOS transistor having a source connected with the drain of said tenth P-channel MOS transistor, a gate connected with the gate of said eleventh P-channel MOS transistor, and a drain connected to the one output of the two outputs of said input differential stage;
a twelfth N-channel MOS transistor having a source connected with the drain of said tenth N-channel MOS transistor, a gate connected with the gate of said eleventh N-channel MOS transistor, and a drain connected to the other output of the two outputs of said input differential stage;
an eleventh N-channel MOS transistor having a source connected with the drain of said ninth N-channel MOS transistor, a gate supplied with the second bias voltage, and a drain connected with the gates of said ninth and tenth N-channel MOS transistors;
a seventh constant current source provided between the drain of said eleventh P-channel MOS transistor and the drain of said eleventh N-channel MOS transistor;
a first capacitance connected between the drain of said tenth P-channel MOS transistor and said output node; and
a second capacitance which was connected between the drain of said tenth N-channel MOS transistor and said output node,
wherein said switch section comprises:
a ninth switch provided between the one output of said input differential stage and the one input of said positive-only output stage, and configured to turn on in response to the first polarity signal;
a tenth switch provided between the one output of said input differential stage and the one input of said negative-only output stage and configured to turn on in response to said second polarity signal;
an eleventh switch provided between the other output of said input differential stage and the other input of said positive-only output stage, and configured to turn on in response to said first polarity signal; and
a twelfth switch provided between the other output of said input differential stage and the other input of said negative-only output stage, and configured to turn on in response to said second polarity signal,
wherein the external input voltage is supplied to the gate of said eighth N-channel MOS transistor and the gate of said eighth P-channel MOS transistor, and the gate of said seventh N-channel MOS transistor and the gate of said seventh P-channel MOS transistor are connected with said output node.

13. The operational amplifier according to claim 7, wherein said input differential stage comprises:
seventh and eighth N-channel MOS transistors having sources connected in common to each other, gates and drains;
a fifth constant current source connected with the sources of said seventh and eighth N-channel MOS transistors;
seventh and eighth P-channel MOS transistors having gates respectively connected with the gates of said first and second N-channel MOS transistors, sources connected in common to each other, and drains;
a sixth constant current source connected with the sources of said seventh and eighth P-channel MOS transistors;
ninth and tenth P-channel MOS transistors having sources connected with fifteenth and sixteenth switches, gates connected in common to each other, and drains respectively connected with the drains of said seventh and eighth N-channel MOS transistors, wherein the drain of said tenth P-channel MOS transistor is connected to one of the two outputs of said input differential stage;
ninth and tenth N-channel MOS transistors having sources connected with seventeenth and eighteenth switches, gates connected to each other, and drains respectively connected with the drains of said seventh and eighth P-channel MOS transistors, wherein the drain of said tenth N-channel MOS transistor is connected to the other of the two outputs of said input differential stage;
said fifteenth switch connected with the high-voltage side power supply voltage;
said sixteenth switch connected with the second power supply voltage;
said seventeenth switch connected with the high-voltage side power supply voltage;
said eighteenth switch connected with the low-voltage side power supply voltage;
a first capacitance connected between the drain of said tenth P-channel MOS transistor and said output node; and
a second capacitance which was connected between the drain of said tenth N-channel MOS transistor and said output node,
wherein said switch section comprises:
a ninth switch provided between the one output of said input differential stage and the one input of said positive-only output stage, and configured to turn on in response to the first polarity signal;
a tenth switch provided between the one output of said input differential stage and the one input of said negative-only output stage and configured to turn on in response to said second polarity signal;
an eleventh switch provided between the other output of said input differential stage and the other input of said positive-only output stage, and configured to turn on in response to said first polarity signal; and
a twelfth switch provided between the other output of said input differential stage and the other input of said negative-only output stage, and configured to turn on in response to said second polarity signal,
wherein the external input voltage is supplied to the gate of said eighth N-channel MOS transistor and the gate of said eighth P-channel MOS transistor, and the gate of said seventh N-channel MOS transistor and the gate of said seventh P-channel MOS transistor are connected with said output node.

14. The operational amplifier according to claim 13, wherein said input differential stage comprises:
a nineteenth switch provided between said fifth constant current source and the first power supply voltage, and configured to turn on in response to the first selection signal and turn off in response to the second selection signal;
a twentieth switch provided between said fifth constant current source and the low-voltage side power supply voltage, and configured to turn off in response to the first selection signal and turn on in response to the second selection signal;
a twenty-first switch provided between said sixth constant current source and the second power supply voltage, and configured to turn on in response to the first selection signal and turn off in response to the second selection signal; and
a twenty-second switch provided between said sixth constant current source and the high-voltage side power supply voltage, and configured to turn off in response to the first selection signal and turn on in response to the second selection signal.

15. The operational amplifier according to claim 12, further comprising;
a first bias voltage source which comprises:
a thirteenth P-channel MOS transistor having a source connected with the high-voltage side power supply voltage, a gate and a drain connected to each other, wherein said first bias voltage is supplied from the gate thereof, and
an eighth constant current source provided between the drain of said thirteenth P-channel MOS transistor and the low-voltage side power supply voltage;
a third bias voltage source which comprises:
a fourteenth P-channel MOS transistor having a source was connected with the high-voltage side power supply voltage and a gate and a drain connected to each other,
a fifteenth P-channel MOS transistor having a source connected with the drain of said fourteenth P-channel MOS transistor and a gate and a drain connected to each other, wherein said third bias voltage is supplied from the gate thereof, and
a ninth constant current source provided between the drain of said fifteenth P-channel MOS transistor and the low-voltage side power supply voltage;
a fifth bias voltage source which comprises:
a sixteenth P-channel MOS transistor having a source connected with the second power supply voltage and a gate a drain connected to each other,
a seventeenth P-channel MOS transistor having a source connected with the drain of said sixteenth P-channel MOS transistor, and a gate and a drain connected to each other, wherein said fifth bias voltage is supplied from the gate thereof, and
a tenth constant current source provided between the drain of said seventeenth P-channel MOS transistor and the low-voltage side power supply voltage;
a second bias voltage source which comprises:
a thirteenth N-channel MOS transistor having a source connected with the low-voltage side power supply voltage and a gate and a drain connected to each other, wherein said second bias voltage is supplied from the gate thereof, and
an eleventh constant current source provided between the high-voltage side power supply voltage and the drain of said thirteenth N-channel MOS transistor;
a sixth bias voltage source which comprises:
a fourteenth N-channel MOS transistor having a source connected with the low-voltage side power supply voltage and a gate and a drain connected to each other,
a fifteenth N-channel MOS transistor having a source connected with the drain of said fourteenth N-channel MOS transistor and a gate and a drain connected to each other, wherein said sixth bias voltage is supplied from the gate thereof, and
a twelfth constant current source provided between the high-voltage side power supply voltage and the drain of said fifteenth N-channel MOS transistor, and
a fourth bias voltage source which comprises:
a sixteenth N-channel MOS transistor having a source connected with the first power supply voltage and a gate and a drain connected to each other,
a seventeenth N-channel MOS transistor having a source connected with the drain of said sixteenth N-channel MOS transistor and a gate and a drain connected to each other, wherein said fourth bias voltage is supplied from the gate thereof, and a thirteenth constant current source provided between the high-voltage side power supply voltage and the drain of said seventeenth N-channel MOS transistor.

16. A driver comprising:

an output section configured to output an output gradation voltage based on display data; and an operational amplifier configured to receive the output gradation voltage as an external input voltage to output on a data line through said output node, wherein said operational amplifier comprises:

an input differential stage comprising one external input receiving an external input voltage and two outputs;

two output stages; and a switch section provided between inputs of said two output stages and the two outputs of said input differential stage, and configured to alternately connect the two outputs of said input differential stage and inputs of a positive-only output stage of said two output stages; and the two outputs of said input differential stage and inputs of a negative-only output stage of said two output stages.

17. A display comprising:

a display section having a data line;

a driver connected with said data line, wherein said driver comprises:

an output section configured to output an output gradation voltage based on display data; and an operational amplifier configured to receive the output gradation voltage as an external input voltage to output on a data line through said output node, wherein said operational amplifier comprises:

an input differential stage comprising one external input receiving an external input voltage and two outputs;

two output stages; and a switch section provided between inputs of said two output stages and the two outputs of said input differential stage, and configured to alternately connect the two outputs of said input differential stage and inputs of a positive-only output stage of said two output stages; and the two outputs of said input differential stage and inputs of a negative-only output stage of said two output stages.

* * * * *